United States Patent
Jeon

(10) Patent No.: US 9,727,254 B2
(45) Date of Patent: Aug. 8, 2017

(54) MEMORY DEVICES, SYSTEMS AND METHODS EMPLOYING COMMAND/ADDRESS CALIBRATION

(71) Applicant: Samsung Electronics Co., Ltd., Suwon-si (KR)

(72) Inventor: Young-Jin Jeon, Hwaseong-si (KR)

(73) Assignee: SAMSUNG ELECTRONICS CO., LTD., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 15/420,350

(22) Filed: Jan. 31, 2017

(65) Prior Publication Data

US 2017/0139612 A1     May 18, 2017

Related U.S. Application Data

(60) Division of application No. 15/193,128, filed on Jun. 27, 2016, now Pat. No. 9,595,314, which is a
(Continued)

(30) Foreign Application Priority Data

Jun. 23, 2011  (KR) .................. 10-2011-0061319

(51) Int. Cl.
*G11C 7/00*  (2006.01)
*G06F 3/06*  (2006.01)
(Continued)

(52) U.S. Cl.
CPC .......... *G06F 3/0614* (2013.01); *G06F 3/0629* (2013.01); *G06F 3/0659* (2013.01);
(Continued)

(58) Field of Classification Search
CPC .............. G06F 3/0614; G11C 11/4076; G11C 11/4096; G11C 11/4087; G11C 11/4093
(Continued)

(56) References Cited

U.S. PATENT DOCUMENTS 6,275,962 B1    8/2001  Fuller et al.
6,279,090 B1 *  8/2001  Manning ................ G11C 7/222
                                                                711/105
(Continued)

FOREIGN PATENT DOCUMENTS

| JP | 2002-025254 | 1/2002 |
| JP | 2009-093769 | 4/2009 |
| KR | 10-2003-0057642 A | 7/2003 |

OTHER PUBLICATIONS

"GDDR5 SGRAM"JEDEC Solid State Technology Association, JEDEC Standard No. 212, Dec. 2009.

*Primary Examiner* — Viet Q Nguyen
(74) *Attorney, Agent, or Firm* — Muir Patent Law PLLC

(57) ABSTRACT

During a command/address calibration mode, a memory controller may transmit multiple cycles of test patterns as signals to a memory device. Each cycle of test pattern signals may be transmitted at an adjusted relative phase with respect to a clock also transmitted to the memory device. The memory device may input the test pattern signals at a timing determined by the clock, such as rising and/or falling edges of the clock. The test pattern as input by the memory device may be sent to the memory controller to determine if the test pattern was successfully transmitted to the memory device during the cycle. Multiple cycles of test pattern transmissions are evaluated to determine a relative phase of command/address signals with respect to the clock for transmission during operation of the system.

11 Claims, 21 Drawing Sheets

Related U.S. Application Data continuation of application No. 14/729,058, filed on Jun. 3, 2015, now Pat. No. 9,401,197, which is a continuation of application No. 14/504,087, filed on Oct. 1, 2014, now Pat. No. 9,076,515, which is a division of application No. 14/295,320, filed on Jun. 3, 2014, now Pat. No. 8,879,342, which is a division of application No. 13/430,438, filed on Mar. 26, 2012, now Pat. No. 8,760,945.

(60) Provisional application No. 61/468,204, filed on Mar. 28, 2011.

(51) Int. Cl.
    *G11C 11/4076* (2006.01)
    *G11C 11/4096* (2006.01)
    *G11C 11/408* (2006.01)
    *G11C 11/4093* (2006.01)

(52) U.S. Cl.
    CPC ........ *G06F 3/0673* (2013.01); *G11C 11/4076* (2013.01); *G11C 11/4082* (2013.01); *G11C 11/4087* (2013.01); *G11C 11/4093* (2013.01); *G11C 11/4096* (2013.01); *G11C 2207/2254* (2013.01)

(58) Field of Classification Search
    USPC .................. 365/193, 191, 189.07, 233.1
    See application file for complete search history.

(56) References Cited

U.S. PATENT DOCUMENTS

| | | | |
|---|---|---|---|
| 6,282,210 B1 | 8/2001 | Rapport et al. | |
| 6,442,644 B1 | 8/2002 | Gustavson et al. | |
| 6,646,953 B1 | 11/2003 | Stark | |
| 6,735,709 B1 | 5/2004 | Lee et al. | |
| 6,941,484 B2* | 9/2005 | To | G06F 1/06 326/93 |
| 7,043,652 B2* | 5/2006 | Matsui | G11C 7/22 713/400 |
| 7,411,862 B2 | 8/2008 | Hein et al. | |
| 7,457,174 B2 | 11/2008 | Braun et al. | |
| 7,624,310 B2 | 11/2009 | Porterfield | |
| 7,702,874 B2 | 4/2010 | Vogt | |
| 7,755,383 B2 | 7/2010 | Jeong et al. | |
| 7,902,887 B2 | 3/2011 | Bae | |
| 7,994,812 B2 | 8/2011 | Osanai et al. | |
| 8,139,430 B2 | 3/2012 | Buchmann et al. | |
| 8,269,538 B2* | 9/2012 | Hassan | G11C 7/1051 327/141 |
| 8,300,464 B2 | 10/2012 | Welker et al. | |
| 8,320,204 B2 | 11/2012 | Nakashima | |
| 8,375,259 B2 | 2/2013 | Porterfield | |
| 8,432,768 B2 | 4/2013 | Ware et al. | |
| 8,516,338 B2 | 8/2013 | Buchmann et al. | |
| 8,533,538 B2 | 9/2013 | Chaudhuri | |
| 8,565,033 B1 | 10/2013 | Manohararajah et al. | |
| 8,595,428 B2 | 11/2013 | Bains et al. | |
| 8,661,285 B2 | 2/2014 | Lee et al. | |
| 8,675,426 B2 | 3/2014 | Ko | |
| 8,687,435 B2 | 4/2014 | Gatzemeier et al. | |
| 8,730,758 B2 | 5/2014 | Lee et al. | |
| 8,739,525 B2* | 6/2014 | Mankame | F03G 7/065 60/527 |
| 8,743,635 B2 | 6/2014 | Kizer | |
| 8,760,945 B2* | 6/2014 | Jeon | G11C 8/18 365/189.07 |
| 8,824,222 B2 | 9/2014 | Ware et al. | |
| 8,824,224 B2 | 9/2014 | Ware | |
| 8,842,492 B2 | 9/2014 | Shaeffer et al. | |
| 8,879,342 B2* | 11/2014 | Jeon | G11C 8/18 365/193 |
| 8,982,650 B2 | 3/2015 | Nishiwaki et al. | |
| 9,025,399 B1 | 5/2015 | Morris et al. | |
| 9,076,515 B2* | 7/2015 | Jeon | G11C 8/18 |
| 9,123,408 B2* | 9/2015 | Jose | G11C 7/222 |
| 9,286,955 B1 | 3/2016 | Stephens | |
| 9,298,557 B2* | 3/2016 | Kuo | G06F 11/1441 |
| 9,401,197 B2* | 7/2016 | Jeon | G11C 8/18 |
| 9,563,597 B2* | 2/2017 | Ware | G11C 5/02 |
| 2003/0026162 A1* | 2/2003 | Matsui | G11C 7/22 365/233.11 |
| 2003/0117864 A1 | 6/2003 | Hampel et al. | |
| 2003/0167417 A1* | 9/2003 | To | G06F 1/06 713/500 |
| 2009/0019323 A1 | 1/2009 | Porterfield | |
| 2010/0271092 A1* | 10/2010 | Zerbe | G06F 13/4243 327/161 |
| 2010/0271094 A1* | 10/2010 | Hassan | G11C 7/1051 327/161 |
| 2011/0216612 A1 | 9/2011 | Ishikawa | |
| 2012/0250433 A1* | 10/2012 | Jeon | G11C 8/18 365/193 |
| 2013/0083611 A1 | 4/2013 | Ware et al. | |
| 2013/0124904 A1 | 5/2013 | Wang et al. | |
| 2013/0167417 A1 | 7/2013 | Vincent | |
| 2013/0311717 A1 | 11/2013 | Kim et al. | |
| 2014/0347941 A1* | 11/2014 | Jose | G11C 7/222 365/191 |
| 2015/0048870 A1 | 2/2015 | Ku | |
| 2015/0089164 A1* | 3/2015 | Ware | G11C 5/02 711/149 |
| 2015/0323971 A1 | 11/2015 | Arai et al. | |
| 2016/0147703 A1 | 5/2016 | Park et al. | |
| 2016/0164521 A1 | 6/2016 | Chung et al. | |

* cited by examiner

FIG. 7

- MRS Command truth table for MRW #41 & MRW #42

| SDRAM COMMAND | SDR CMD | | DDR CA Pins (10) | | | | | | | | | | |
|---|---|---|---|---|---|---|---|---|---|---|---|---|---|
| | CKE | /CS | CA0 | CA1 | CA2 | CA3 | CA4 | CA5 | CA6 | CA7 | CA8 | CA9 | CK EDGE |
| MRW #41 | H | L | L | L | L | L | MA0 H | MA1 L | MA2 L | MA3 H | MA4 L | MA5 H | ← |
| | | | L | L | L | L | MA0 H | MA1 L | MA2 L | MA3 H | MA4 L | MA5 H | → |
| MRW #42 | H | L | L | L | L | L | MA0 L | MA1 H | MA2 L | MA3 H | MA4 L | MA5 H | ← |
| | | | L | L | L | L | MA0 L | MA1 H | MA2 L | MA3 H | MA4 L | MA5 H | → |

FIG. 8

- Address to DQ Mapping in CA Calibration Mode (X32 Organization)

| Output | CA0R | CA1R | CA2R | CA3R | CA4R | CA5R | CA6R | CA7R | CA8R | CA9R |
|---|---|---|---|---|---|---|---|---|---|---|
| DQ | DQ0 | DQ1 | DQ2 | DQ3 | DQ4 | DQ5 | DQ6 | DQ7 | DQ8 | DQ9 |
| | Address bits registered at rising edge of CK | | | | | | | | | |
| Output | CA0F | CA1F | CA2F | CA3F | CA4F | CA5F | CA6F | CA7F | CA8F | CA9F |
| DQ | DQ10 | DQ11 | DQ12 | DQ13 | DQ14 | DQ15 | DQ16 | DQ17 | DQ18 | DQ19 |
| | Address bits registered at falling edge of CK | | | | | | | | | |

FIG. 9

- Address to DQ Mapping in Address Training Mode (X32 Organization)

| Output | Address bits registered at rising edge of CK | | | | | | | | | |
|---|---|---|---|---|---|---|---|---|---|---|
| | CA0R | CA1R | CA2R | CA3R | CA4R | CA5R | CA6R | CA7R | CA8R | CA9R |
| DQ(even) | DQ0 | DQ2 | DQ4 | DQ6 | DQS0 | DQ8 | DQ10 | DQ12 | DQ14 | DQS1 |
| Output | Address bits registered at falling edge of CK | | | | | | | | | |
| | CA0F | CA1F | CA2F | CA3F | CA4F | CA5F | CA6F | CA7F | CA8F | CA9F |
| DQ(odd) | DQ1 | DQ3 | DQ5 | DQ7 | $\overline{DQS0}$ | DQ9 | DQ11 | DQ13 | DQ15 | $\overline{DQS1}$ |

FIG. 11

- Address to DQ Mapping in CA Calibration Mode (X32 Organization)

| | | | | | | | | | | | |
|---|---|---|---|---|---|---|---|---|---|---|---|
| Output | | Address bits registered at rising edge of CK | | | | | | | | | |
| | CA0R | CA1R | CA2R | CA3R | CA4R | CA5R | CA6R | CA7R | CA8R | CA9R | |
| DQ | DQ0 | DQ2 | DQ4 | DQ6 | DQ8 | DQ10 | DQ12 | DQ14 | DQ16 | DQ18 | |
| Output | | Address bits registered at falling edge of CK | | | | | | | | | |
| | CA0F | CA1F | CA2F | CA3F | CA4F | CA5F | CA6F | CA7F | CA8F | CA9F | |
| DQ | DQ1 | DQ3 | DQ5 | DQ7 | DQ9 | DQ11 | DQ13 | DQ15 | DQ17 | DQ19 | |

FIG. 12

- Address to DQ Mapping in CA Calibration Mode (X32 Organization)

| | | | | | Address bits registered at rising edge of CK | | | | | |
|---|---|---|---|---|---|---|---|---|---|---|
| Output | CA0R | CA1R | CA2R | CA3R | CA4R | CA5R | CA6R | CA7R | CA8R | CA9R |
| DQ | DQ0 | DQ1 | DQ2 | DQ3 | DQ4 | DQ5 | DQ6 | DQ7 | DQ8 | DQS0 |
| | | | | | Address bits registered at falling edge of CK | | | | | |
| Output | CA0F | CA1F | CA2F | CA3F | CA4F | CA5F | CA6F | CA7F | CA8F | CA9F |
| DQ | DQ9 | DQ10 | DQ11 | DQ12 | DQ13 | DQ14 | DQ15 | DQ16 | DQ17 | DQS1 |

FIG. 14

- MRS Command truth table for MRW #43 & MRW #44

| SDRAM COMMAND | SDR CMD | | DDR CA Pins (10) | | | | | | | | | | |
|---|---|---|---|---|---|---|---|---|---|---|---|---|---|
| | CKE | /CS | CA0 | CA1 | CA2 | CA3 | CA4 | CA5 | CA6 | CA7 | CA8 | CA9 | CK EDGE |
| MRW #43 | H | L | L | L | L | L | MA0 H | MA1 H | MA2 L | MA3 H | MA4 L | MA5 H | ← |
| | | | L | L | L | L | MA0 H | MA1 H | MA2 L | MA3 H | MA4 L | MA5 H | → |
| MRW #44 | H | L | L | L | L | L | MA0 L | MA1 L | MA2 H | MA3 H | MA4 L | MA5 H | ← |
| | | | L | L | L | L | MA0 L | MA1 L | MA2 H | MA3 H | MA4 L | MA5 H | → |

FIG. 15

- Address to DQ Mapping in CA Calibration Mode (X16 Organization)

| Output | | | | | | Address bits registered at rising edge of CK | | | | |
|---|---|---|---|---|---|---|---|---|---|---|
| | CA0R | CA1R | CA2R | CA3R | CA4R | CA5R | CA6R | CA7R | CA8R | CA9R |
| DQ | DQ0 | DQ1 | DQ2 | DQ3 | DQ4 | DQ5 | DQ6 | DQ7 | DQ8 | DQ9 |
| Output | | | | | | Address bits registered at falling edge of CK | | | | |
| | CA0F | CA1F | CA2F | CA3F | CA4F | CA5F | CA6F | CA7F | CA8F | CA9F |
| DQ | DQ0 | DQ1 | DQ2 | DQ3 | DQ4 | DQ5 | DQ6 | DQ7 | DQ8 | DQ9 |

FIG. 16

- Address to DQ Mapping in CA Calibration Mode (X16 Organization)

| | \multicolumn{10}{c|}{Address bits registered at rising edge of CK} |
|---|---|---|---|---|---|---|---|---|---|---|
| Output | CA0R | CA1R | CA2R | CA3R | CA4R | CA5R | CA6R | CA7R | CA8R | CA9R |
| DQ | DQ0 | DQ1 | DQ2 | DQ3 | DQ4 | DQ0 | DQ1 | DQ2 | DQ3 | DQ4 |
| | \multicolumn{10}{c|}{Address bits registered at falling edge of CK} |
| Output | CA0F | CA1F | CA2F | CA3F | CA4F | CA5F | CA6F | CA7F | CA8F | CA9F |
| DQ | DQ5 | DQ6 | DQ7 | DQ8 | DQ9 | DQ5 | DQ6 | DQ7 | DQ8 | DQ9 |

FIG. 17

- Address to DQ Mapping in CA Calibration Mode (X16 Organization)

| | | | | | | | | | | |
|---|---|---|---|---|---|---|---|---|---|---|
| Output | | Address bits registered at rising edge of CK | | | | | | | | |
| | CA0R | CA1R | CA2R | CA3R | CA4R | CA5R | CA6R | CA7R | CA8R | CA9R |
| DQ | DQ0 | DQ1 | DQ2 | DQ3 | DQS0 | DQ0 | DQ1 | DQ2 | DQ3 | DQS1 |
| Output | | Address bits registered at falling edge of CK | | | | | | | | |
| | CA0F | CA1F | CA2F | CA3F | CA4F | CA5F | CA6F | CA7F | CA8F | CA9F |
| DQ | DQ4 | DQ5 | DQ6 | DQ7 | $\overline{DQS0}$ | DQ4 | DQ5 | DQ6 | DQ7 | $\overline{DQS1}$ |

FIG. 19

- Address to DQ Mapping in CA Calibration Mode (X16 Organization)

| | Address bits registered at rising edge of CK | | | | | | | | | |
|---|---|---|---|---|---|---|---|---|---|---|
| Output | CA0R | CA1R | CA2R | CA3R | CA4R | CA5R | CA6R | CA7R | CA8R | CA9R |
| DQ | DQ0 | DQ2 | DQ4 | DQ6 | DQ8 | DQ0 | DQ2 | DQ4 | DQ6 | DQ8 |
| | Address bits registered at falling edge of CK | | | | | | | | | |
| Output | CA0F | CA1F | CA2F | CA3F | CA4F | CA5F | CA6F | CA7F | CA8F | CA9F |
| DQ | DQ1 | DQ3 | DQ5 | DQ7 | DQ9 | DQ1 | DQ3 | DQ5 | DQ7 | DQ9 |

FIG. 20

- Address to DQ Mapping in Address Training Mode (X16 Organization)

| Output | \multicolumn{10}{c|}{Address bits registered at rising edge of CK} |
|---|---|---|---|---|---|---|---|---|---|---|
|  | CA0R | CA1R | CA2R | CA3R | CA4R | CA5R | CA6R | CA7R | CA8R | CA9R |
| DQ(even) | DQ0 | DQ2 | DQ4 | DQ6 | DQS0 | DQ0 | DQ2 | DQ4 | DQ6 | DQS1 |
| Output | \multicolumn{10}{c|}{Address bits registered at falling edge of CK} |
|  | CA0F | CA1F | CA2F | CA3F | CA4F | CA5F | CA6F | CA7F | CA8F | CA9F |
| DQ(odd) | DQ1 | DQ3 | DQ5 | DQ7 | $\overline{DQS0}$ | DQ1 | DQ3 | DQ5 | DQ7 | $\overline{DQS1}$ |

MEMORY DEVICES, SYSTEMS AND METHODS EMPLOYING COMMAND/ADDRESS CALIBRATION

CROSS-REFERENCE TO RELATED APPLICATIONS

This application is a divisional of and claims priority to U.S. patent application Ser. No. 15/193,128 filed on Jun. 27, 2016, which is a continuation of and claims priority to U.S. patent application Ser. No. 14/729,058 filed on Jun. 3, 2015, which is a continuation of and claims priority to U.S. patent application Ser. No. 14/504,087 filed on Oct. 1, 2014, which is a divisional and claims priority to U.S. patent application Ser. No. 14/295,320 filed on Jun. 3, 2014, which is a divisional and claims priority to U.S. patent application Ser. No. 13/430,438 filed on Mar. 26, 2012, which claims the benefit of U.S. Provisional Application No. 61/468,204, filed on Mar. 28, 2011, in the U.S. Patent and Trademark Office and Korean Patent Application No. 10-2011-0061319, filed on Jun. 23, 2011, in the Korean Intellectual Property Office, the disclosures of each of which are incorporated herein in their entirety by reference.

BACKGROUND

The inventive concept relates to a memory devices, systems and methods, and more particularly, to command/address calibration.

In a memory system, for example, a dynamic random access memory (DRAM) system, a signal transmitted and received via a bus between a memory controller and a DRAM experiences propagation delays. The propagation delays may be affected by various factors, such as interconnection capacitors or a parasitic capacitances existing on the bus, a substrate, or the like. As a data rate of the DRAM increases, a propagation delay and/or variations of propagation delays degrade signal integrity. It is desirable to find an optimal signal window or compensate for signal skew between signals, such as between data signal and a clock signal, a command signal and a clock signal and/or address signal and a clock signal.

SUMMARY

Command/address calibration methods, and memory devices and memory systems that employ command/address calibration are disclosed. According to an aspect of the inventive concept, there is provided a method of communication with a memory device, comprising sending a calibration command over a command/address bus; sending a sequence of n first test signals over the command/address bus, wherein n is an integer equal to 2 or more; sending a clock signal over a first clock line with each of the n first test signals, each of the n first test signals being sent at a respective first to nth phase with respect to the clock signal, each of the first to nth phases being different from one another; receiving a sequence of n second test signals over a data bus respectively derived from the sequence of n first test signals sent over the command/address bus; comparing the n first test signals to the n second test signals; and determining a preferred phase of signals to be sent over the command/address bus with respect to the clock signal in response to the comparing the n first test signals to the n second test the received n second test signals.

Each of the n first test signals comprise a first plurality of bits sent in parallel over the command/address bus may be followed by a second plurality of bits sent in parallel over the command/address bus.

Each of the first plurality of bits and the second plurality of bits may comprise a packet.

For each of the n first test signals, the first plurality of bits may be sent at one of a rising edge of the clock signal and a falling edge of the clock signal, and the second plurality of bits may be sent at the other of the rising edge of the clock signal and the falling edge of the clock signal.

At least a part of the sequence of n second test signals may be received over a data strobe line, or received over lines dedicated to calibration at least during a calibration mode.

The method may further comprise determining if each of the second test signals is the same as a corresponding first test signal.

The preferred phase may be determined to correspond to one of the first to nth phases.

Determining the preferred phase may be derived from determining a sequence of phases of the first to nth phases, each phase of the sequence of phases corresponding to a second test signal determined to be valid.

According to another aspect, a method of interface training may comprise sending a first calibration signal to a semiconductor device over a command/address bus; sending a clock signal to the semiconductor device with the sending of the first calibration signal, the clock signal providing a timing to the semiconductor device to latch logic levels of the first calibration signal; receiving a second calibration signal from the semiconductor device over a data bus, the second calibration signal being derived from latched logic levels of the first calibration signal; sending command and address signals over the command/address bus to the first semiconductor device with the sending of the clock signal, a phase between the command and address signals and the clock signal being responsive to the second calibration signal.

The method may further comprise sending a read request signal over a first line separate from the command/address bus to the semiconductor device while sending the first calibration signal.

The first line may be a clock enable line.

The first calibration signal may comprise a sequence of data packets transmitted at a rate at least twice that of the period of the clock signal.

Sending of a first calibration signal to the semiconductor device may include sending a training pattern over each of multiple lines of the command/address bus.

The training pattern may be the same for each of the multiple lines of the command/address bus.

The phase between the command and address signals and the clock signal may be individually adjusted for each of the multiple lines of the command/address bus.

A first signal may be sent over a first line of the command/address bus with a first phase with respect to the clock signal and a second signal may be sent over a second line of the command/address bus with a second phase with respect to the clock signal.

When the semiconductor device is a first semiconductor device, the method may include sending a third calibration signal to a second semiconductor device over the command/address bus; sending the clock signal to the second semiconductor device with the sending of the third calibration signal, the clock signal providing a timing to the second semiconductor device to latch logic levels of the third calibration signal; receiving a fourth calibration signal from the second semiconductor device over the data bus, the fourth calibration signal being derived from latched logic levels of the third calibration signal; sending command and address signals over the command/address bus to the second semiconductor device with the sending of the clock signal, a phase between the command and address signals and the clock signal being responsive to the fourth calibration signal.

According to another aspect, a method of calibrating communication over a command/address bus of a memory device may comprise receiving a clock signal over a clock signal line; receiving a calibration command over the command/address bus; receiving a first test data packet over the command/address bus at one of a rising edge of the clock signal and a falling edge of the clock signal to generate first information; receiving a second test data packet over the command/address bus at the other of the rising edge of the clock signal and the falling edge of the clock signal to generate second information; and transmitting the first and second information over a data bus.

The method may include receiving commands and addresses over the command/address bus at rising and falling edges of the clock signal.

The invention also contemplates systems and devices. For example, a semiconductor device may comprise a clock generator configured to generate a clock signal; a clock output terminal, connected to the clock generator and configured to output the clock signal; a command generator circuit, configured to generate commands; an address generator circuit, configured to generate addresses; a plurality of command/address terminals; a command/address buffer having an output connected to the command/address terminals, the command/address buffer being connected to the command generator circuit and the address generator circuit to transmit command and address signals externally from the semiconductor device via the command/address terminals; a phase controller configured to control the command/address buffer to transmit a sequence of n training patterns over the command/address bus, n being an integer greater than 2, the phase controller configured to adjust a phase of at least some of the n training patterns with respect to the clock signal; data terminals; and a data buffer connected to the data terminals, wherein the phase controller is configured to adjust a phase of command and address signals with respect to the clock signal in response to first information received by the data buffer via the data terminals. Systems may include such devices and/or implement such methods. The invention is not limited to the features described in this Summary and the scope and applicability will be apparent by reference to the following detailed description.

BRIEF DESCRIPTION OF THE DRAWINGS

Exemplary embodiments of the inventive concept will be more clearly understood from the following detailed description taken in conjunction with the accompanying drawings in which:

FIG. 7 is a diagram for describing a mode register command setting method according to a first embodiment;

FIG. 8 is a diagram showing an example for describing mapping between command/address signals and DQ pads according to an embodiment;

FIG. 9 is a diagram showing another example for describing mapping between command/address signals and DQ pads according to an embodiment;

FIG. 11 is a diagram showing an example for describing mapping between command/address signals and DQ pads according to another embodiment;

FIG. 12 is a diagram showing another example for describing mapping between command/address signals and DQ pads according to another embodiment;

FIG. 14 is a diagram for describing a mode register command setting method according to another embodiment;

FIG. 15 is a diagram showing an example for describing mapping between command/address signals and DQ pads according to another embodiment;

FIG. 16 is a diagram showing another example for describing mapping between command/address signals and DQ pads according to another embodiment;

FIG. 17 is a diagram showing another example for describing mapping between command/address signals and DQ pads according to another embodiment;

FIG. 19 is a diagram showing an example for describing mapping between command/address signals and DQ pads according to another embodiment;

FIG. 20 is a diagram showing another example for describing mapping between command/address signals and DQ pads according to another embodiment;

DETAILED DESCRIPTION OF THE EMBODIMENTS

Figure 1:
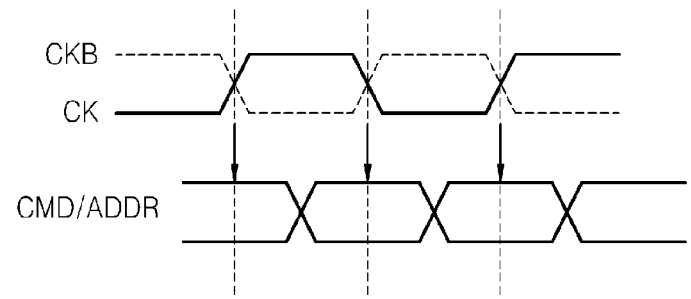
FIGS. 1 and 2 are timing diagrams for describing the concept of command/address calibration.

Hereinafter, exemplary embodiments of the inventive concept will be described in detail with reference to the accompanying drawings, in which preferred embodiments of the invention are shown. The exemplary embodiments of the inventive concept are provided to more fully describe the inventive concept to those of ordinary skill in the art. This invention may, however, be embodied in different forms and should not be construed as limited to the exemplary embodiments set forth herein. That is, the exemplary embodiments are just that—examples—many implementations and variations are possible that do not require the various details disclosed herein. Various changes may be made to the inventive concept, and the inventive concept may have various forms. However, such embodiments are not intended to limit the inventive concept to the disclosed specific embodiments and it should be understood that the embodiments include all changes, equivalents, and substitutes within the spirit and scope of the inventive concept. Throughout the drawings, like reference numerals refer to like components. In the accompanying drawings, structures may have been exaggerated for clarity.

The terminology used herein is for the purpose of describing embodiments only and is not intended to be limiting of exemplary embodiments. As used herein, the singular forms are intended to include the plural forms as well, unless the context clearly indicates otherwise. It will be further understood that the terms "comprises," "including" and/or "has" (and related terms) specify the presence of stated feature, number, step, operation, component, element, or a combination thereof but do not preclude the presence or addition of one or more other features, numbers, steps, operations, components, elements, or combinations thereof, unless otherwise noted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

From a semiconductor memory device, a high-speed operation, as well as low power consumption, is desired. For example, a dynamic random access memory (DRAM) satisfying low power double data rate (LPDDR) specifications may be desired. An LPDDR DRAM system bi-directionally transmits and receives data between a DRAM and an external device, such as a memory controller, at both rising and falling edges of a clock signal.

As a way to speed-up memory operations, commands and addresses may be transmitted to a memory device (e.g., a memory chip, such as a DRAM nor NAND flash chip) at both rising and falling edges of a clock signal. The memory device is configured to latch in command and/or address information at both the rising edge(s) and the falling edge(s) of the clock signal. A common signal used to transmit both a command signal and an address signal is referred to as a command/address signal CMD/ADDR or CA. Pins, terminals, bus lines, internal conductors or other signal paths that transmit the command/address signal may also be referenced herein using the acronym CA.

Figure 2:
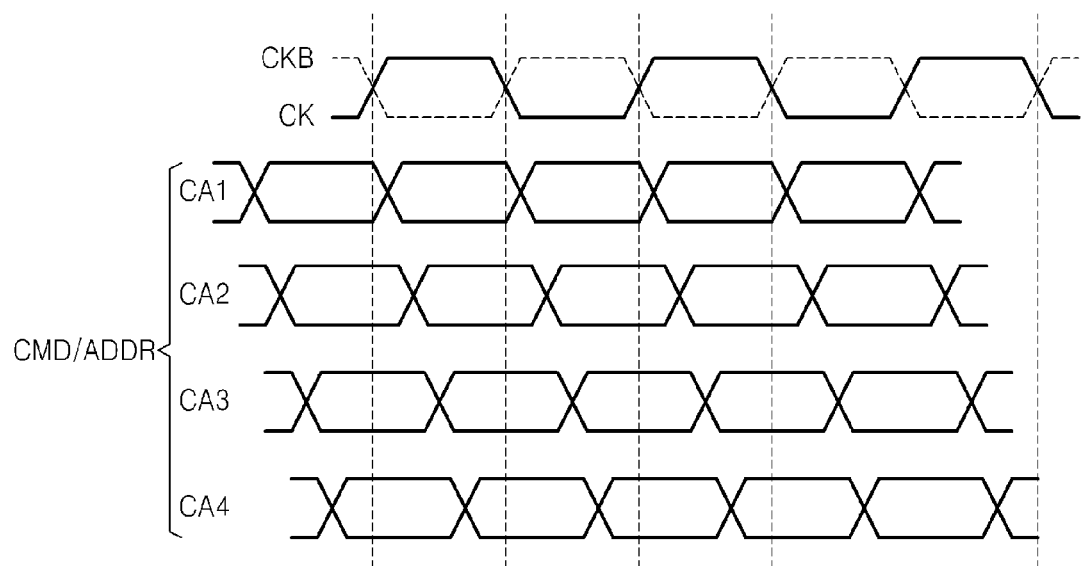

FIGS. 1 and 2 are timing diagrams for describing an example of command/address calibration.

Referring to FIG. 1, the relative timing of a pair of clock signals (clock signal pair CK and CKB) and multiple command/address signals CMD/ADDR may be adjusted (together or individually) through calibration such that the middle of each command/address CMD/ADDR window is positioned to optimally time an input operation, such as a latching operation, of the memory device. FIG. 1 represents the command/address signals CMD/ADDR having been adjusted so that the center portion of each command/address CMD/ADDR window is at a timing when a rising edge of clock signal CK intersects the falling edge of clock signal CKB (or vice versa—when a rising edge of clock signal CKB intersects the falling edge of clock signal CK). The intersections may correspond to a time the clock signals CK and CKB equal each other (e.g., have the same voltage level). While FIG. 1 shows only command/address CMD/ADDR windows of one command/address CMD/ADDR signal (e.g., a signal on conductor wire of a plural conductor CMD/ADDR bus), multiple command/address CMD/ADDR signals (e.g., multiple command/address CMD/ADDR signals received on respective different command/address CMD/ADDR signal paths) may each be aligned as shown in FIG. 1 and the following discussion is relevant for each such command/address CMD/ADDR signal. Command/address signal timing is adjusted or matched to rising/falling edges of the clock signals CK and CKB. As the middle of the command/address CMD/ADDR window is at a position corresponding to an intersection between the rising and falling edges of the clock signals CK and CKB, a timing margin of the command/address CMD/ADDR may be maximized or otherwise relatively improved. FIG. 1 may represent a relative timing of the clock signals CK and CKB and the command/address signals CMD/ADDR as seen from a memory device receiving these signals. The clock signals CK and CKB and the command/address signals CMD/ADDR may be generated by an external source (e.g., a memory controller, a CPU, a host computer, etc.), and the relative timing between clock signals CK and CKB and the command/address signals CMD/ADDR as generated by the external source may alter during transmission and thus, the relative timing as generated may be different from that seen by the memory device (e.g., the relative timing generated by the external source may be different from that shown in FIG. 1).

Due to variations between signal paths, such as variations in layout, signal driving capability, etc., a propagation time difference may be generated between the clock signals CK and CKB and the command/address signal CMD/ADDR during transmission of these signals from an external source to a memory device. As shown in FIG. 2, the middle of the command/address CMD/ADDR window may precede or follow the rising and falling edges of the clock signals CK and CKB, thereby reducing the timing margin of the command/address CMD/ADDR.

Among four command/address signals CMD/ADDR (CA1, CA2, CA3 and CA4) shown in FIG. 2, for the first and second command/address signals CMD/ADDR CA1 and CA2, the timing of the clock signals CK and CKB may lag middle of the windows of CA1 and CA2 signals. If the timing of the first and second command/address signals CMD/ADDR CA1 and CA2 are postponed through calibration, the middle portion of each command/address CMD/ADDR window of CA1 and CA2 may be positioned to correspond to an intersection between the rising edge and the falling edge of the clock signals CK and CKB. The middle portion of each command/address CMD/ADDR window of CA1 and CA2 may occur with the rising/falling edges of CK and CKB when received by the memory device after such postponement. For the fourth command/address signal CMD/ADDR CA4, the timing of the clock signals CK and CKB may be postponed or the timing of the fourth command/address signal CMD/ADDR CA4 may be advanced through calibration, such that the middle of each command/address CMD/ADDR window is at a position corresponding to an intersection between the rising edge and the falling edge of the clock signals CK and CKB.

Figure 3:
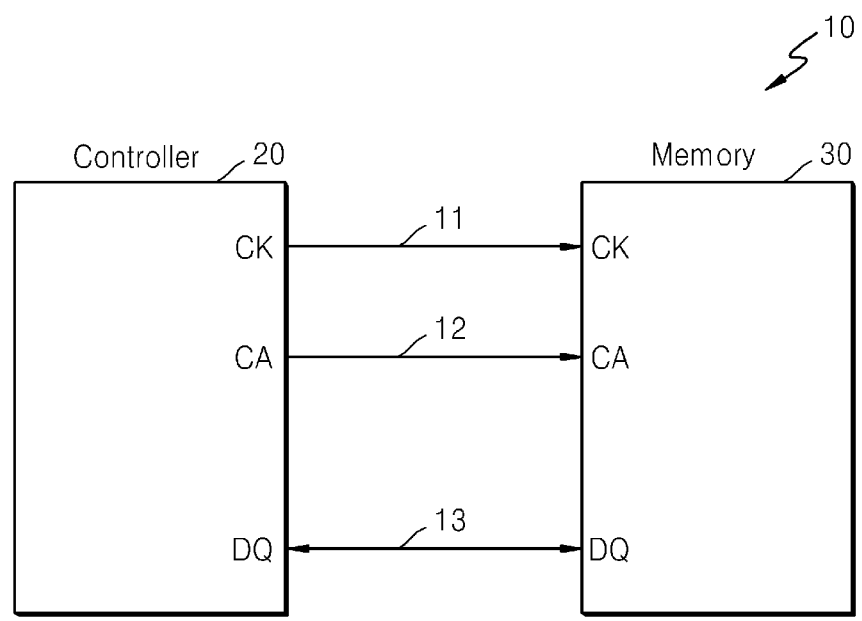
FIG. 3 is a block diagram for describing a memory system which performs command/address calibration.

FIG. 3 is a block diagram of an exemplary a memory system 10 that performs command/address calibration.

Referring to FIG. 3, the memory system 10 includes a memory controller 20 and a memory device 30, between which are connected a clock signal line 11, a command/address bus 12, and a DQ bus 13. A clock signal CK generated by the memory controller 20 is provided to the memory device 30 through the clock signal line 11. The clock signal CK may be provided as a continuous alternating inverted signal, together with an inverted clock signal CKB. The inverted clock signal CKB may be provided with the clock signal CK, that is, generated by the memory controller 20 and provided to the memory device 30 (not shown in FIG. 3). Rising and falling edges of a pair of the clock signals CK and CKB may be detected based on intersections between the clock signals CK and CKB, thereby improving timing accuracy.

The single clock signal CK (without transmitting clock signal CKB) may also be provided as a continuous alternating inverted signal to the clock signal line 11. This implementation reduces signal lines (and terminals) between the memory device 30 and memory controller 20. In this case, to identify rising and falling edges of the clock signal CK, the clock signal CK and a reference voltage Vref may be compared with each other. If noise fluctuation occurs in the reference voltage Vref, a shift occurs in detection of the clock signal CK, thereby degrading timing accuracy when compared to the use of the pair of clock signals CK and CKB. Therefore, it may be desirable to transmit continuous alternating inverted signals that complement each other by using the pair of clock signals CK and CKB. In this case, the clock signal line 11 may include two signal lines that transmit the clock signal CK and the clock signal CKB. The clock signal CK described in the embodiments of the inventive concept may be described as the pair of clock signals CK and CKB. For convenience's sake, the pair of clock signals CK and CKB is described as the clock signal CK.

The command/address signal CA generated by the memory controller 20 is provided to the memory device 30 through the command/address bus 12. The command/address bus 12 may carry a command signal or an address signal to the memory device 30 (exclusively at any one time) and/or the command/address bus 12 may carry a command signal and an address signal at the same time to the memory device 30. The memory controller 20 may transmit a mode register set (MRS) command indicating a command/address calibration mode through the command/address bus 12. The MRS command may include a calibration mode entry command and a calibration mode exit command. A calibration start signal indicating the calibration mode entry command or a calibration end signal indicating the calibration mode exit command may be transmitted through the command/address bus 12.

When the command/address bus 12 is composed of command/address signals CA of n signal lines (e.g., conductors), where n is a natural number, and the command/address signals CA is input at rising and falling edges of the clock signal CK (e.g., the command/address signals CA are transmitted at a double data rate (DDR), $2n$ bits of command/address CA information may be provided through command/address buss 12 every clock cycle to the memory device 30 from the memory controller 20. A command/address signal CA input at the rising edge of the clock signal CK and a command/address signal CA input at the falling edge of the clock signal CK may each constitute different sets of n bits of command/address CA information.

In normal operation, DQ bus 13 transmits data signals DQ between the memory controller 20 and the memory device 30 (e.g., in a write operation, data signals DQ are transmitted to the memory device 30 from controller, and in a read operation, data signals DQ are transmitted from the memory device 30 to the memory controller 20). Information regarding the command/address calibration (described in further detail below) may be output on the DQ bus 13 to be provided to the memory controller 20. The DQ bus 13 is connected to DQ pads (and/or other device terminals, such as solder bumps) of both the memory controller 20 and the memory device 30. Mapping of the calibration command/address information signals and the DQ pads may be set in various ways.

Figure 5:
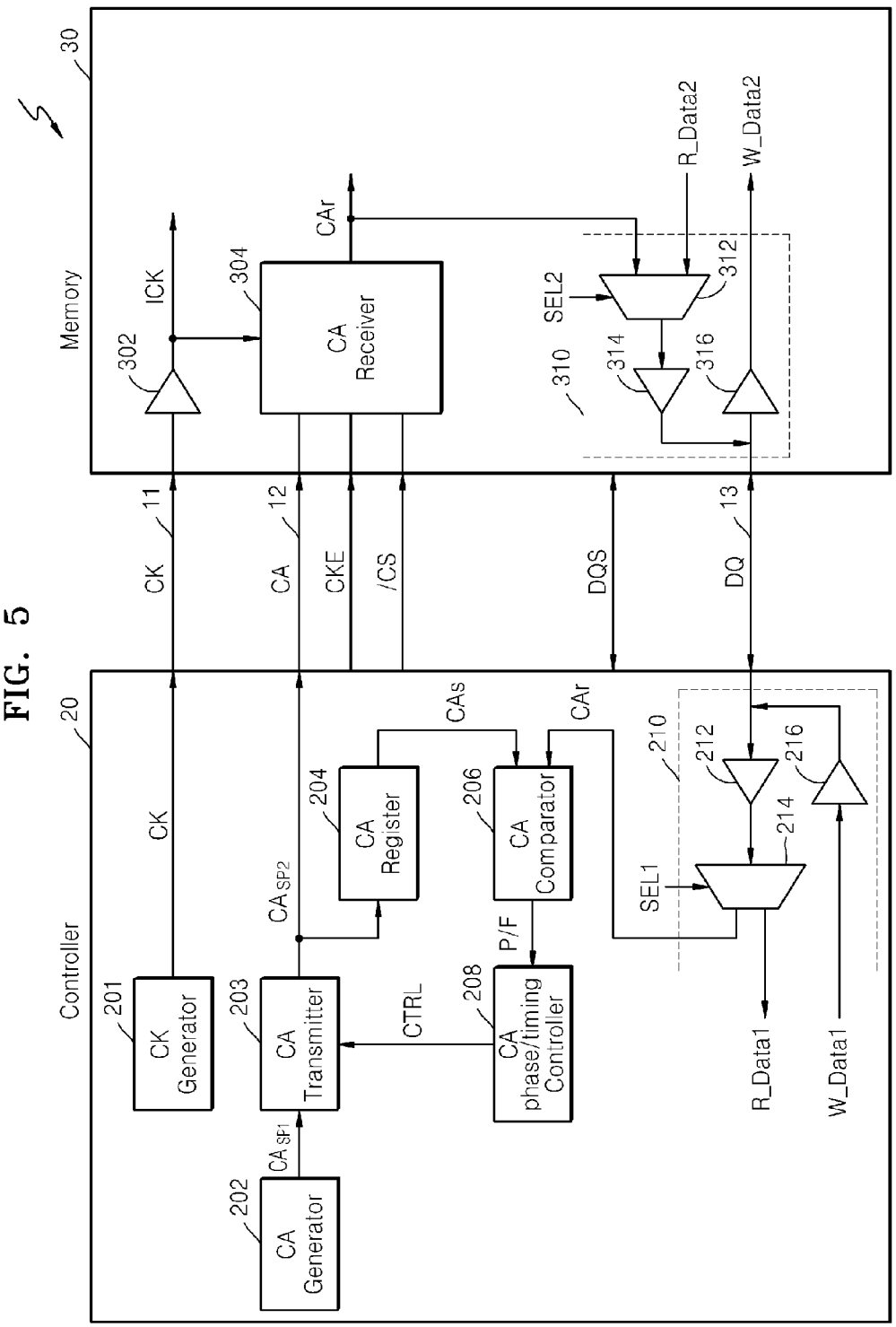
FIG. 5 is a block diagram of a first example of a memory system which may be used to implement one or more command/address calibration embodiments described herein.

For example, when the bit organization of the data signal DQ of the memory device 30 is x32 (DQ[31:0]), the number of DQ bus lines is 32. When the command/address bus consists of 10 conductors and the command/address signal CA transmits 10 bits at both the rising and falling edges of the clock signal CK, there may be 20 bits of command/address signals CA received by the memory device 30 per clock cycle of clock CK. Since the number of DQ bus lines, 32, is greater than the number of command/address signals, 20, each DQ bus line may correspond to a single one of the command/address signal bits CA, providing information of that corresponding single command/address signal bit (e.g., two DQ bus lines may transmit command/address information regarding the command/address calibration of a single line of the command/address bus 12). Thus, mapping may be performed such that, for each cycle of clock signal CK, a value of the command/address signals input at the rising edges of the clock signal CK is output to 10 DQ pads [9:0] and a value of the 10-bit command/address signals input at the falling edges of the clock signal CK is output to the other 10 DQ pads [19:10]. Thus, while command/address CA signals may be transmitted to the memory device 30 at a double data rate (DDR) (two sets of bits for every cycle of clock CK), the information regarding the command/address calibration may be transmitted back to the memory controller 20 from the memory device 30 at a single data rate (SDR) (one set of bits for every cycle of clock CK). Note that the DQ bus may transmit data relative to a clock different from clock CK. FIG. 5, discussed further below, shows an embodiment where data is transmitted relative to a data strobe clock DQS.

When the bit organization of the data signal DQ of the memory device 30 is x16 (DQ[15:0]), the number of DQ bus lines is 16. Since the number of DQ bus lines, 16, is less than the number of command/address signal bits (received per clock cycle CK), 20, the DQ bus lines may be insufficient to transmit information regarding the command/address calibration as one set of bits in during one cycle of the clock CK. Thus, the DQ bus 13 may transmit information regarding the command/address calibration sequentially. For example, the DQ bus may transmit command/address calibration information regarding the 10-bit command/address signals input into the memory device 30 at the rising edges of the clock signal CK at one time (e.g., on DQ bus lines DQ[0:9]) and, at a later time, transmit command/address calibration information regarding the 10-bit command/address signals input at the falling edges of the clock signal CK (e.g., again on DQ bus lines DQ[0:9]).

Figure 4A:
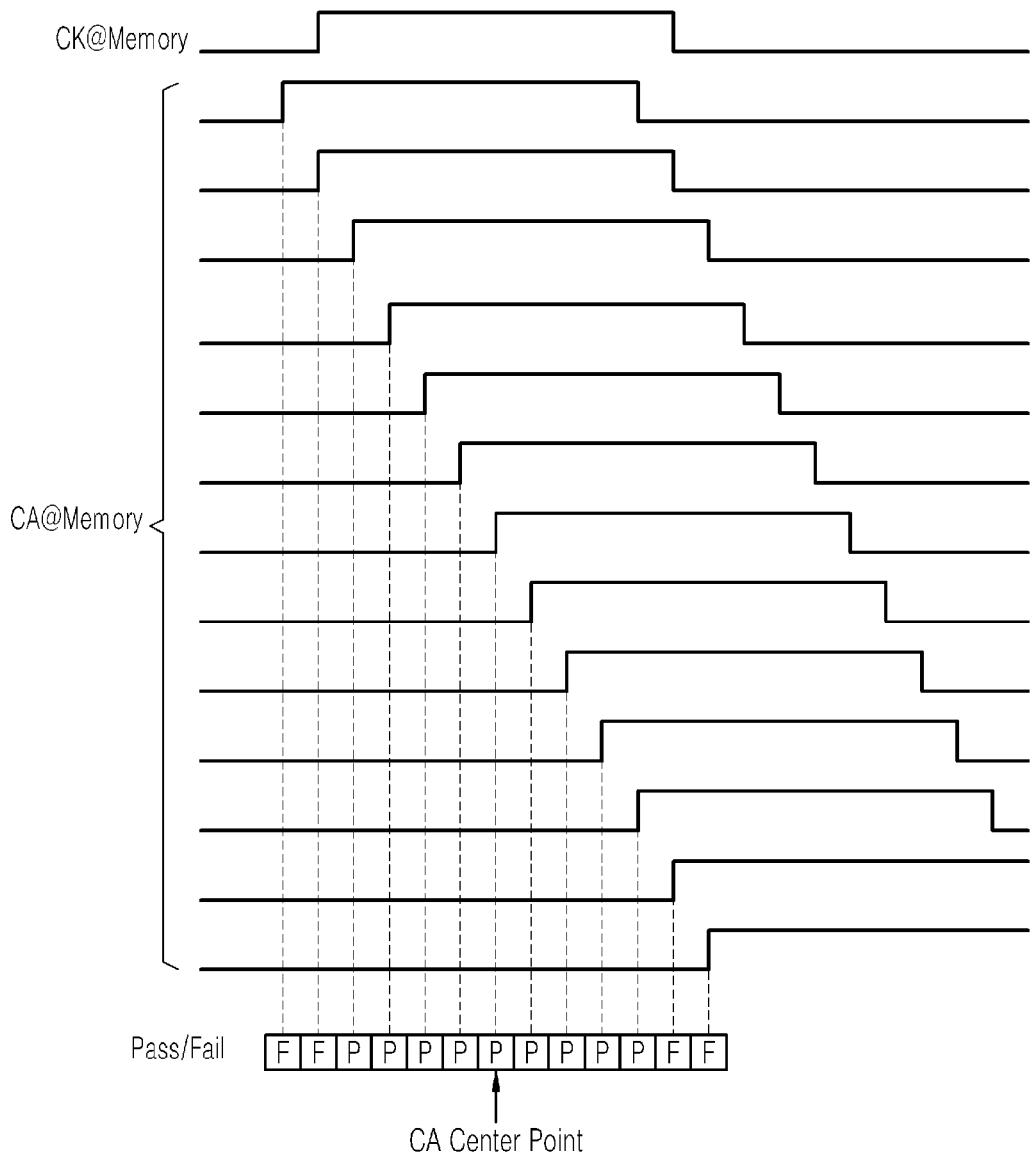
FIGS. 4A and 4B are diagrams for describing command/address calibration such as that performed by the memory system shown in FIG. 3.
Figure 4B:
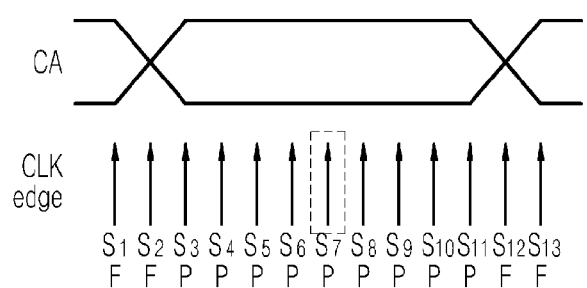

FIGS. 4A and 4B are diagrams for describing command/address calibration that may be performed by the memory system 10 shown in FIG. 3.

Referring to FIGS. 4A and 4B, in conjunction with FIG. 3, the memory controller 20 detects whether a relative position (or timing) of the command/address signal CA window and the edge of the clock signal CK as received by the memory device 30 (provided from the memory controller 20) is such so that the memory device 30 successfully interprets the command/address signal. FIGS. 4A and 4B shows several successful interpretations of the command/address signal as a pass (or P) and unsuccessful interpretations of the command/address signal as a fail (F). FIG. 4A represents multiple cycles of the transmission of a command/address signal along a single command/address line of command/address bus 12. Each cycle of transmitting a calibration test pattern is adjusted by the controller to change the relative phase of the clock CK and the command/address signal as compared to the previous transmission cycle. The example of FIGS. 4A and 4B show this relative phase being changed by $\frac{1}{20}^{th}$ of a clock CK cycle (e.g., 18 degrees) for each subsequent transmission cycle. The relative phase may be changed more or less each transmission cycle, depending on the accuracy desired. Note that the relative phase of the clock CK and the command/address signal as received by the memory device 30 for a particular transmission cycle may not be the same as the relative phase of the clock CK and the command/address signal as transmitted by the controller. Due to different characteristics of the transmission of the clock signal CK and the signal line of the command address bus 12, the time from transmission from the controller 20 to the receipt by memory device 30 may differ. Such different characteristics may include a difference in signal path length, difference in conductance (e.g., due to conductor size) of the signal path, parasitic capacitances of the signal path (e.g., from neighboring lines), temperature, etc. The memory controller 20 transmits the clock signal CK to the memory device 30 through the clock signal line 11 and transmits the command/address signal CA to the memory device 30 through a signal line of the command/address bus 12. The memory device 30, after receiving the phase-adjusted command/address signal CA, transmits the command/address signal CA as interpreted by the memory device 30 to the memory controller 20 through the DQ bus 13. The memory controller 20 detects which transmission cycles of the command/address signal successfully transmitted their information to the memory device 30 (pass or P) and which of the transmission cycles were unsuccessful (fail or F).

FIG. 4A shows a clock signal (CK@Memory) and multiple a command/address signals received by memory device 30 over a line of the command/address bus, received over several transmission cycles. For ease of description and to better highlight the shifting of the relative phase of the command/address signal and the clock CK, the command/address signals are shown vertically stacked in FIG. 4A, rather than in a continuous timing diagram, however it should be noted that each of the CA@Memory signals shown in FIG. 4A are received sequentially in time (e.g., over the same signal line of the command/address bus CA) in this example. In FIG. 4B, when the edge of the clock signal CK exists at a position S1 or S2 of the command/address signal CA, the memory device 30 may fail to successfully interpret the command/address signal CA (e.g., fail to latch the proper high or low logic of the command/address signal CA at the window) and the memory controller 20 may decide the transmission cycle associated with S1 and S2 as fail F. When the edge of the clock signal CK exists at a position S3, S4, S5 , S6 , S7, S8, S9, S10 , or S11, the memory device may successfully interpret the command/address signal CA (e.g., successfully latch the proper high or low logic of the command/address signal CA), and the memory controller 20 may decide the transmission cycles associated with S3, S4, S5, S6, S7, S8, S9, S10, or S11 as pass P. When the edge of the clock signal CK exists at a position S12, or S13 of the command/address signal CA, the memory controller 20 may decide the transmission cycles associated with S12 and S13 as fail F.

The description of FIGS. 4A and 4B represent that a timing of the clock CK received by the memory device 30 (CK@Memory) should have a timing so that an edge of the clock signal CK must occur at the same time as the logic of the command/address signal CA to be latched (e.g., occur at the correct logic window of the command/address signal CA). However, this representation is for ease of description and is not necessary. The timing of the edge of the clock signal CK may not need to be at the same time as the logic to be latched, but may be shifted in time, for example. For example, a clock other than CK may be responsible for triggering the latching of the command/address signal CA by memory device 30. For example, an internal clock ICK may be generated by the memory device 30 in response to clock signal CK, and this internal clock ICK may be used by a buffer (e.g., CA receiver 304 in FIG. 5) of the memory device 30 to latch the logic of the command/address signal CA on the CA bus 12 at a time of a rising edge or a falling edge of ICK. Even if the externally received clock CK and the internally generated clock ICK have the same frequency and duty cycle (which may not be the case), CK and ICK may be shifted in time. Thus, edges of the external clock CK may not occur at the same time as the logic of the command/address signal CA to be latched (e.g., the edges may be outside (before or after) the window of the logic high "1" of the command/address signal CA which is latched by the memory device 30). As another example, even when the edges of clock CK are directly input to a buffer of memory device 30 to trigger latching of the signal input to the memory device, there may be some delay before the latching action is sufficient to latch the logic of the input signal.

The memory device 30 may transmit information regarding the command/address calibration to the controller 20 on the data bus DQ as noted above. For example, the memory device 30 may transmit the signal on the command/address signal line of the CA command/address bus 12 as interpreted (e.g., as latched) by the memory device 30. Thus, during a calibration transmission cycle, if the memory controller transmits a "1" (e.g., logic high) to the memory device on a signal line of the command/address bus 12, but the relative phase of clock CK and this transmission is such that the memory device 30 is triggered to latch the signal on this signal line outside the appropriate signal window, the memory device may inaccurately interpret the transmitted signal as a "0". Then, the memory device may transmit the value "0" over a signal line of the DQ data bus 13. The memory controller 20 may determine the transmission associated with the transmission cycle was unsuccessful and decide the transmission was a failure F. In a subsequent transmission cycle during the command/address calibration, the relative phase of the clock CK and the transmission of the command/address calibration signal (e.g., the "1") may be shifted so that memory device 30 is triggered to latch the signal line in the signal window representing the "1", and this value "1" may be transmitted to the memory controller 20 (as the command/address calibration information). The memory controller 20 may thus compare the command/address calibration signal transmitted to the memory device 30 and the command/address calibration information (the value "1") received from the memory device 30 are the same and determine the subsequent transmission cycle to be successful (pass P).

The memory controller 20 may analyze the group of transmission cycles of the command/address calibration to determine a relative phase between the clock CK and command/address signals to be sent on the command/address signal line of the command/address CA signal during normal operations of the memory system 10. This optimum relative phase may be implemented by the memory controller 20 in transmitting command and address information to the memory device 30 during normal operation. For example, the optimum relative phase may be determined by grouping all transmission cycles determined as a pass P and selecting a the relative phase of the transmission cycle in the center of this group. For example, as the transmission cycles associated with S3, S4, S5, S6, S7, S8, S9, S10, and S11 were successful (pass P) in FIGS. 4A and 4B, the memory controller 20 may select the relative phase (between clock CK and the command/address calibration signal) of the transmission cycle associated with S7 as the optimum phase. Alternatively, the memory controller 20 may select the optimum phase as an average of the relative phase associated with the first and last successful transmission cycles (when the relative phases of each transmission cycle are in order (e.g., 0 degrees, 15 degrees, 30 degrees, etc.)—in the example of FIGS. 4A and 4B, this would be average of the relative phase of the transmission cycles associated with S3 and S11. Alternatively, the memory controller 20 may select the optimum phase as an average of the relative phase associated with the last and first unsuccessful transmission cycles (when the relative phases of each transmission cycle are in order) which sandwich the successful transmission cycles—in the example of FIGS. 4A and 4B, this would be the average of the relative phase of the transmission cycles associated with S2 and S12. In this way, command/address calibration may be performed.

While calibration on a single command/address signal CA (on a single line of the command/address CA bus 12) has been described in the current embodiment, this command/address calibration may be performed for multiple command/address signals CA transmitted through the command/address bus 12. This calibration may done at the same time for all of the signal lines of the command/address bus 12. The memory controller 20 may determine an optimum relative phase (e.g., as described above) for each of the signal lines of the command/address bus 20 and individually adjust the relative phase for each of the signal lines of the command/address bus 20.

Alternatively, the memory controller 20 may determine an optimum relative phase for the entire group of signal lines and select the same optimum phase for all the group of signal lines of the command/address bus 12. In selecting the same optimum relative phase for the entire group of signal lines, the memory controller 20 may determine a successful transmission cycle (pass P) as one where all bits of the command/address calibration signal are successfully interpreted by the memory device 30 and determine an unsuccessful transmission cycle (fail F) as one where at least one of the bits of the command/address calibration signal are unsuccessfully interpreted by the memory device 30. The optimum relative phase for the entire group of signal lines may be determined in a manner similar to that described above with respect to a single signal line of the command/address bus 12 by analyzing the pass P and fail F designations of the transmission cycles.

In another alternative, the memory controller 20 may determine an optimum relative phase for multiple groups of signal lines comprising the command/address bus 12. The optimum relative phase for each of the multiple groups of signal lines may be determined as described herein for determining an optimum relative phase for the entire group of signal lines comprising the command/address bus 12. The groups of signal lines of the command/address bus 12 may comprise a group of neighboring signal lines (e.g., with no other signal lines of the command/address bus 12 interposed).

In another alternative, the optimum relative phase may be determined as described above for only a subset of the signal lines of the command/address bus 12. That is, command/address calibration signals may be transmitted by the controller on only a subset of the signal lines of the command/address bus 12 and/or the memory device 30 may transmit command/address calibration information regarding only a subset of the signal lines of the command/address bus. The optimum relative phase may be determined for this subset of signal lines of the command/address bus 12. The remainder of the signal lines of the command address/bus 12 may have an optimum phase determined based upon the optimum relative phase determined for the subset of signal lines. This may be done, e.g., by interpolating (and/or extrapolating) the optimum relative phase of immediately neighboring signal lines (of the subset of signal lines) as an optimum relative phase. For example, if the command/address bus comprises 10 signal lines (able to send 10 parallel bits of information at a time), the odd lines (where the signal lines are positioned in the order of 1 to 10) may have an optimum relative phase determined as described with respect to FIGS. 4A and 4B (by multiple transmission cycles of command/address calibration signals by the controller 20 to the memory device 30 and sending command/address calibration information from the memory device 30 to the memory controller 20). Even lines of the command/address bus 12 may have their optimum relative phase determined by interpolating the previously determined optimum relative phase of the neighboring odd lines of the command/address bus 12. Thus, signal line 2 of the command/address bus 12 may have its optimum relative phase determined as the average of the optimum relative phase of signal lines 1 and 3. Other interpolation besides averaging of immediate neighbors can be performed (e.g., if signal lines 1, 2 and 3 are not evenly spaced or have some known difference in length, and/or the interpolation may include the optimum relative phase determinations of more than two odd signal lines). Similarly, signal line 4 may have its optimum relative phase determined by averaging or interpolating the optimum relative phase determined for signal lines 3 and 5. As signal line 10 would not have two neighboring signal lines in this example, its optimum relative phase may be chosen to be the same as that of signal line 9, or may be extrapolated from multiple odd signal lines (e.g., from signal lines 7 and 9).

FIG. 5 is a block diagram of an example of the memory system 10 which may be used to implement any command/address calibration embodiment described herein.

Referring to FIG. 5, the memory system 10 includes memory controller 20 and memory device 30. The memory controller 20 may include a clock generator 201, a command/address generator 202, a command/address transmitter 203, which hereinafter may be referred to as a CA transmitter, a register 204, a comparator 206, a phase/timing controller 208, and an input/output unit 210.

The memory controller 20 provides the clock signal CK generated from the clock generator 201 to the memory device 30 through the clock signal line 11. The command/address generator 202 generates an initial command/address signal CA0 and provides the same to the CA transmitter 203.

The CA transmitter 203 receives an initial command/address signal $CA_{sp1}$ having a first phase p1, and adjusts a phase or timing of the initial command/address signal $CA_{sp1}$ in response to a control signal CTRL of the phase/timing controller 208 to generate a phase adjusted command/address signal $CA_{sp2}$ with a second phase p2. CA transmitter 203 may also be controlled by control signal CTRL to substantially maintain the phase of the initial command/address signal CA so that the first phase p1 is substantially the same as the second phase p2 (for ease of explanation, signal $CA_{sp2}$ is referred to as a phase adjusted command/address signal CA even though in certain circumstances, the initial command/address $CA_{sp1}$ signal may not have a phase adjustment). The phase adjusted command/address signal $CA_{sp2}$ is sent to the register 204 and the information represented by phase adjusted command/address signal $CA_{sp2}$ is stored in the register 204 as $CA_s$. The phase adjusted command/address signal $CA_{sp2}$ is provided to the memory device 30 through the command/address bus 12. The phase adjusted command/address signal $CA_{sp2}$ is provided to the memory device 30, together with the clock signal CK.

The register 204 stores the information of the phase adjusted command/address signal $CA_{sp2}$ as sent command/address information $CA_s$. The comparator 206 compares sent command/address information $CA_s$ stored in the register 204 with received command/address calibration information $CA_r$ (received by memory device 30 and transmitted back to memory controller 20 as described herein) output from the input/output unit 210. The comparator 204 compares information $CA_s$ with information $CA_r$ to generate a pass or fail signal P or F.

The phase/timing controller 208 generates the control signal CTRL instructing a phase shift of the initial command/address signal $CA_{sp1}$ according to the pass or fail information P or F generated by the comparator 206. The control signal CTRL is provided to the CA transmitter 203, and the phase or timing of the initial command/address signal $CA_{sp1}$ is adjusted to generate the phase-adjusted command/address signal $CA_{sp2}$.

In a normal operation mode, the data input/output unit 210 receives read data R_Data1 transmitted from the memory device 30 through the DQ bus 13 or transmits write data W_Data1 to be written to the memory device 30 through the DQ bus 13. In addition, in the command/address (CA) calibration mode, the data input/output unit 210 may receive command/address calibration information $CA_r$ corresponding to the phase-adjusted command/address signal $CA_{sp2}$ received by the memory device 30 from the memory controller 20 through the DQ bus 13. The command/address calibration information $CA_r$ may be the information latched in by memory device 30 in response to clock CK (e.g., with the rising and/or falling edge of clock CK) when the phase-adjusted command/address signal $CA_{sp2}$ is being sent to the memory device 30. $CA_r$ may be the same information as $CA_s$ when the timing of CK is such to properly interpret (or latch) the phase-adjusted command/address signal $CA_{sp2}$ or $CA_r$ may be different than $CA_s$ when the memory device 30 incorrectly interprets the phase-adjusted command/address signal $CA_{sp2}$. The data input/output unit 210 outputs the command/address signal information $CA_r$ to the comparator 206.

The input/output unit 210 may include an input buffer 212, a selection unit 214, and an output buffer 216. The input buffer 212 and output buffer 216 may comprise latches and/or amplifiers to respectively latch and/or amplify received signals. The input buffer 212 is connected to receive data and command/address calibration information $CA_r$ transmitted through the DQ bus 13 from memory device 30. The selection unit 214 transmits the data received by the input buffer 212 as read data R_Data1 to an internal circuit block (not shown) of the memory controller 20 in response to a first selection signal SEL1 in the normal operation mode, or transmits the command/address calibration information $CA_r$ received by the input buffer 212 to the comparator 206 in response to the first selection signal SEL1 in the CA calibration mode. The selection unit 214 may be multiplexer. The input buffer 212 may interpret the command/address calibration information $CA_r$ correctly the DQ bus 13 has been calibrated in a DQ calibration mode prior to the CA calibration mode and/or the transmission of command/address calibration information $CA_r$ on the DQ bus 13 to the input buffer 212 is at a slower rate to assure latching of the information on the DQ bus at 13 the correct window (e.g., the slower rate of transmission is at an single data rate (SDR) when the command/address calibration is at a double data rate (DDR)). In this instance, the command/address calibration information $CA_r$ received on the DQ bus 13 is the same as the command/address calibration information $CA_r$ transmitted by the data input/output unit 210 to the CA comparator 206. The output buffer 216 transmits the write data W_Data1 to be written to the memory device 30 through the DQ bus 13.

The memory device 30 includes a clock buffer 302, a command/address receiver 304, which will hereinafter be referred to as a CA receiver 304, and a data input/output unit 310. The clock buffer 302 receives the clock signal CK transmitted through the clock signal line 11 to generate an internal clock signal ICK. The phase adjusted command/address signal $CA_{sp2}$ is transmitted to the memory device 30 through the command/address bus 12. The CA receiver 304 generates the command/address calibration information $CA_r$ in response to the internal clock signal ICK, which may occur when enabled by a chip selection signal /CS and a clock enable signal CKE. The chip selection signal /CS and the clock enable signal CKE may be provided separately from the command/address signal line 12, as in FIG. 5, or may be carried on the command/address signal line 12 for transmission to the memory 30, unlike as shown in FIG. 5.

The clock enable signal CKE may be used as a pseudo command which acts as a read command of the phase adjusted command/address signal $CA_{sp2}$ transmitted through the command/address bus 12 in the CA calibration mode. The CA receiver 304 generates the command/address calibration information $CA_r$ according to the phase adjusted command/address signal $CA_{sp2}$ latched based on a timing of ICK (e.g., a rising edge and/or falling edge) received when the clock enable signal CKE is in an active state and when memory device 30 is enabled by the chip selection signal /CS. The command/address calibration information $CA_r$ is provided to the data input/output unit 310.

The data input/output unit 310 is connected to receive the command/address calibration information $CA_r$ and read data R_Data2 transmitted from an internal circuit block (e.g., data read path circuitry connected to a memory array that stores the read data R_Data2) (not shown) of the memory device 30 and transmits the received read data R_Data2 to the DQ bus 13 in response to a second selection signal SEL2 in a normal read operation mode, or transmits the second command/address signal CA2 to the DQ bus 13 in response to the second selection signal SEL2 in a calibration mode. The data input/output unit 310 receives write data W_Data1 to be written to the memory device 30 through the DQ bus 13 and transmits the received write data W_Data1 to the internal circuit block of the memory device 30 in a normal write mode. The data input/output unit 310 includes a selection unit 312, an output buffer 314, and an input buffer 316. The selection unit 312 selects one of the second command/address signal CA2 output from the command/address receiver 304 and the read data R_Data2 provided from the internal circuit block of the memory device 30, in response to the second selection signal SEL2, and transmits the selected signal or data to the output buffer 314, according to the normal operation mode or the calibration mode. The selection unit 312 may be a multiplexer.

The output buffer 314 transmits the command/address calibration information $CA_r$ or the read data R_Data2 output from the selection unit 312 to the DQ bus 13. The input buffer 316 receives data transmitted through the DQ bus 13 and transmits the receive data as write data W_Data2 to the internal circuit block of the memory device 30. For example, the write data W_Data2 may be transmitted via data write path circuitry to a memory array to be written into the memory array. The data write path circuitry and the data read path circuitry may share circuitry.

In the current embodiment, the command/address calibration information $CA_r$ output from the output buffer 314 of the memory device 30 is provided to the memory controller 20 through the DQ bus 13. Also, command/address calibration information $CA_r$ output from the output buffer 314 of the memory device 30 may be provided to the memory controller 20 through a data strobe (DQS) line(s) and the DQ bus 13. The data input/output unit 210 of the memory controller 20 and the data input/output unit 310 of the memory device 30 may be connected to each other through the DQS line(s) and the DQ bus 13.

CA calibration in the memory system 10 may be performed as below. The CA transmitter 203 of the memory controller 20 generates the command/address signal $CA_{sp2}$ by adjusting the phase or timing of the initial command/address signal $CA_{sp1}$ in response to the control signal CTRL of the phase/timing controller 208. The control signal CTRL may also have a value that maintains the phase of command/address signal, as noted previously. The CA receiver 304 of the memory device 30 receives the phase adjusted command/address signal $CA_{sp2}$ at a timing in accordance with the internal clock signal ICK and when enabled by the clock enable signal CKE to generate the command/address calibration information $CA_r$. The command/address calibration information $CA_r$ of the memory device 30 is transmitted to the DQ bus 13 in response to the second selection signal SEL2. Before calibration of command/address signals, a value of the phase adjusted command/address signal $CA_{sp2}$ transmitted from the memory controller 20 and a value of the command/address calibration information $CA_r$ interpreted (e.g., latched) by the memory device 30 may be different from each other, e.g., due to noise generated during signal transmission and/or variations in signal transmission timing between clock CK and signals transmitted by the CA bus 12. Calibration of the command/address signals addresses this problem.

The memory controller 20 transmits the command/address calibration information $CA_r$ to the comparator 206 received via the DQ bus 13 in response to the first selection signal SEL1 in the command/address calibration mode. If the DQ bus 13 calibrated in a DQ calibration mode prior to the CA calibration mode, then the chance of incorrectly interpreting the command/address calibration information $CA_r$ by the memory controller 20 (e.g., as interpreted by input buffer 212) is reduced. The comparator 206 compares a value of the command/address signal $CA_{sp2}$, transmitted by the memory controller 20 to the memory device 30 and stored in the register 204, with a value of the command/address calibration information $CA_r$ received by the memory controller and, generates a pass signal P if they are the same as each other and a fail signal F if they are different. The phase/timing controller 208 generates the control signal CTRL instructing a new phase shift of the initial command/address signal $CA_{sp1}$ (to obtain a new phase adjusted command/address signal $CA_{sp2}$ having a new relative phase difference with clock CK) and repeats the process for the new initial command/address signal $CA_{sp1}$ having a different relative phase with respect to clock CK. After multiple cycles of this process (each with a different phase shift of the initial command/address signal $CA_{sp1}$ by the CA transmitter 203) the controller analyzes the group of pass P and fail F signals to determine the optimal relative phase of the CA signal line (or lines or bus) for normal operation. Although not shown in FIG. 5, the control signal CTRL may be transmitted to the clock generator 201 to adjust the timing or phase of the clock signal CK to adjust the relative phase of the command/address signal and the clock signal CK.

By repeating the foregoing CA calibration, the phase/timing controller 208 of the memory controller 20 determines that the optimum timing (e.g., the middle of the passed P positions) to time the input (e.g., latching) of the command/address signal to the middle portion of the command/address signal CA window, and generates a command/address signal CA such that the middle of the command/address signal CA window corresponds to such input by the memory device 30 (which may correspond to an edge of the clock signal CK), and provides the generated command/address signal CA and clock CK to the memory device 30 with the optimum relative phase between the command/address signal CA and clock CK. Thus, when the timing of the input (e.g., latching) of the command/address signal corresponds to the edge(s) of the clock signal CK received by the memory device 30, the memory device 30 receives the command/address signal CA for which the middle of an effective window corresponds to rising and falling edges of the clock signal CK, strictly speaking, rising and falling edges of the clock signals CK and CKB.

While calibration on the single command/address signal on a single line of the command/address bus 12 has been described, such calibration may be performed for plural or all of the lines of command/address bus as noted previously.

Figure 6:
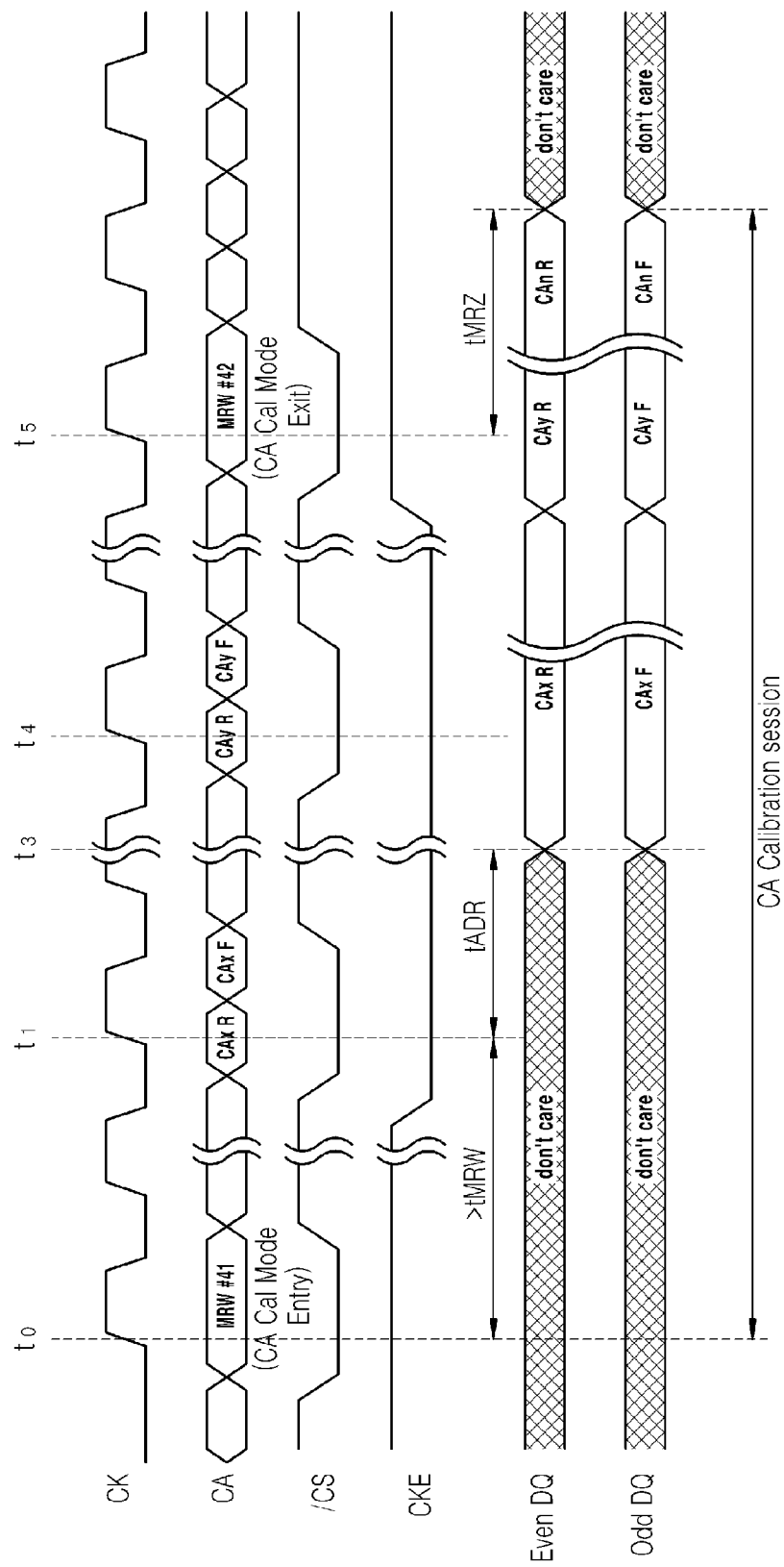
FIG. 6 is a table for describing a command/address calibration method according to a first embodiment.

FIG. 6 is a diagram for describing an exemplary command/address calibration method. FIG. 6 is a timing diagram for describing a command/address calibration method that may be implemented in the memory system 10, in which the bit organization of the data DQ of the memory device 30 is x32 (the DQ bus is composed of 32 DQ signal lines connected to 32 DQ terminals (e.g., pads, bumps, etc.) of the memory device 30 and 32 DQ terminals of the memory controller 20.

Referring to FIG. 6, in conjunction with FIG. 5, the memory controller 20 generates the clock signal CK for the memory device 30. The memory controller 20 sends an enter command/address calibration mode instruction to the memory device 30. The memory controller 20 transmits the enter command/address calibration mode instruction through the command/address bus 12. The enter command/address calibration mode instruction may be input using a mode register set (MRS) command format to program a mode register of the memory device to indicate a command/address calibration mode. The memory device 30 may be responsive to the mode register set information to respond to the command/address calibration mode indication to enter the command/address calibration mode. The memory controller 20 may transmit the command/address end signal through the command/address bus 12. The command/address end signal may be input using a MRS command indicating exit from the calibration mode.

At time $t_0$, the command/address calibration start signal is received through the command/address bus 12 at the memory device, together with activation of a logic low level of the chip selection signal /CS. A rising edge of clock signal CK received by the memory device 20 triggers the latching of the enter command/address calibration mode instruction. For example, a first mode register command (MRW#41) is transmitted as the enter command/address calibration mode instruction. When command/address signals CA[9:0] of 10 bits are carried on the command/address bus 12, the MRW#41 command may comprise command/address signals CA[3:0] to indicate the command is a mode register setting command, and command/address signals CA[9:4] to indicate the mode register setting command is a command to enter into command/address calibration mode.

In this example, the MRW#41 command is input at both the rising and falling edges of the clock signal CK; in FIG. 6, the MRW#41 command is first latched by the memory device in response to the rising edge of clock CK at time $t_0$ and is latched a second time by the memory device 30 in response to the immediately subsequent falling edge of the clock CK. That is, the same MRW#41 command is input at the rising and falling edges of the clock signal CK corresponding starting at time $t_0$ of the clock signal CK. This is because, when an MRS command is input at a double data rate (DDR) through a command/address signal line, an error may be generated such that a memory device having a high operation frequency misses the MRS command. Also, a different command may be erroneously interpreted as the enter command/address calibration mode command. To reduce the possibility of error, the same MRW#41 command is input at the rising and falling edges of the clock signal CK corresponding to the timing $t_0$ of the clock signal CK. That is, as the same command/address signal is input at the rising edge and the falling edge of the clock signal CK, a similar result as in transmission at a single data rate (SDR) may be obtained and a failure in entering the calibration mode (or an unintended entry into calibration mode), especially caused when the command/address signal line is not yet calibrated, may be reduced.

After a delay of a predetermined time from the time $t_0$ when the MRW#41 command is first input, the clock enable signal CKE is activated (active with a low logic level during address/command calibration in FIG. 6) together with activation of the logic low level of the chip selection signal /CS. At time $t_1$ command/address signal CAxR is sent by memory controller 20 and received by memory device 30, followed subsequently by the transmission and receipt of CAxF at the next half clock period (here the immediate subsequent edge of the clock CK). The command/address signals CAxR and CAxF are transmitted from the memory controller 20 to the memory device 30 through the command/address bus 12. The time tMRW may be a mode register set write cycle time to provide sufficient time for the memory device 30 to write indication data to the mode register set of the memory device 30.

In this example, command/address signals CAxR constitute a plurality of signals transmitted on all lines of the command/address bus 12 that are input at the rising edge of the clock signal CK, and the command/address signals CAxF constitute a plurality of signals transmitted on all lines of the command/address bus 12 that are input at the falling edges of the clock signal CK. The pair of CAxR and CAxF may constitute a command/address test pattern signal that is transmitted to the memory device during the command/address calibration to determine if the memory device properly interprets the information represented by the test pattern signal. In the example of FIG. 6, the test pattern (sent for each relative phase sequence) comprises a sequence of two bits (two logic windows of the command/address calibration signal) for each command/address signal line of the command/address bus 12. However, the test pattern may comprise a sequence of more than two bits, or may comprise one bit (the description with respect to FIGS. 4A and 4B may imply a one bit test pattern in the transmission of the phase adjusted command/address signal $CA_{sp2}$, however, phase adjusted command/address signal $CA_{sp2}$ may be a one bit, two bit, or more than two bit sequence sent over each (or some) of the lines of the command/address bus 12). The command/address signal CAxR and the command/address signal CAxF input to the memory device 30 through the command/address bus 12 may be different signals representing different sets of bits. For example, when the command/address bus 12 is composed of command/address signals CA[9:0] of 10 bits, the command/address signal CAxR of 10 bits and the command/address signal CAxF of 10 bits may be distinguished as different signals. Thus, the command/address calibration signals CA[9:0] of 20 bits may be input to the memory device 30 through command/address terminals (pins, pads, solder bumps, etc.) (not shown) of the memory device 30 connected with the command/address bus 12 of 10 bits. The memory device 30 may input (e.g., latch) the command/address calibration signals at a timing determined by the edges clock CK (e.g., at the same time or at a predetermined or fixed time before or after the appropriate triggering edge of clock CK). The memory device 30 may transmit the inputted command calibration signals (as interpreted by the memory device—which may be interpreted correctly or incorrectly) to the memory controller 30, as noted above, for example, with respect to FIGS. 4A, 4B and/or 5.

As there is a demand for the memory device 30 to have large capacity, the degree of integration and the number of memory cells increase. As the number of memory cells increases, the number of address bits for addressing the memory cells also increases. The increase in the number of address pins leads to the increase in chip size. Therefore, a method for suppressing the increase in the number of address pins required most in a memory chip is needed. Since command/address signals are input at both rising and falling edges of a clock signal in this example, the number of command/address pins of the memory device 30 may be reduced.

In this example, during calibration mode of the command/address bus, a read command cannot be transmitted from the memory controller 20 through the command/address signal line. Thus, the clock enable signal CKE acts as a read command of the command/address signals CAxR and CAxF in the calibration mode of the command/address signal bus. When the clock enable signal CKE is activated at a logic low level, the command/address signals CAxR and CAxF are input at a timing determined by the edges of clock CK and results thereof are output through data bus DQ 13 to the memory controller 20. Thus, the clock enable signal CKE is used as a pseudo command and enables the memory device to input the command/address calibration test pattern (e.g., signals CAxR and CAxF). The phase adjusted command/address signal $CA_{sp2}$ transmitted from the memory controller 20 in the embodiment described with respect to FIG. 5 corresponds to the value of the command/address signals CAxR or CAxF CAyR and CAyF in FIG. 6 (hereinafter, generically referred to as CAnR and CAnF). Each CAnR and CAnF pair correspond to a cycle of a transmission of a phase adjusted command/address signal $CA_{sp2}$, each cycle transmitting the command/address signal CAnR and CAnF signal pair with a new relative phase difference with respect to clock CK as compared to previous CAnR and CAnF signals. The adjusted phase difference for each CAnR and CAnF signal pair is not shown in FIG. 6 for ease of explanation (see FIGS. 4A and 4B and related description). Thus, n (n being an integer equal to two or more) test command/address test pattern signals (e.g., n CAnR and CAnF signal pairs) may be sent over the command/address bus with a clock signal, where each of the n test pattern signals being sent a different respective first to nth phase with respect to the clock signal.

At time $t_3$, after a delay of time tADR from time $t_1$ of the clock signal CK at which the clock enable signal CKE is activated, the value of the command/address calibration test pattern CAxR and CAxF input by the memory device 30 as interpreted (e.g., latched) by the memory device 30 (corresponding to command/address calibration information $CA_r$) is output from the memory device 30 to the memory controller 20 in the command/address signal CAxR or CAxF through the DQ bus 13. Time tADR may be predetermined, and based on a known timing of the operation of the memory device. (Note that in FIG. 6, the portions of the timing diagram illustrating the timings of CK, CA CS and CKE in vertical alignment with the dashed line representing time $t_3$ are at a later time than time $t_3$ as represented by the break symbol in these timings.) As shown in FIG. 6, the values of the command/address signal CAxR input by the memory device 30 (e.g., command/address calibration information associated with CAxR) triggered by the rising edge of clock CK are output on the "even DQ" lines of the DQ bus 13 (DQ0, DQ2, etc.) over a time period during which plural clock edge of clock CK occur. In this instance, the time of the command/address calibration information output to the memory controller 20 may occur over plural periods of clock CK. As shown by FIG. 6, the values of the command/address signal CAxF input by the memory device (e.g., command/address calibration information associated with CAxF) are output on DQ bus 13 at the same time and manner as the values of the command/address signal CAxR input by the memory device 30, except they are output on the "odd DQ" lines of the DQ bus 13. When viewed from a top down view, the DQ bus lines may (but need not) run substantially in the same directions between the memory device 30 and the controller 20 and be numbered from 0 to m, where m+1 is the number of bus lines of the DQ bus.

If the relative phase of the clock CK and the address/command calibration test pattern signal CAxR and CAxF triggers input (e.g., latching) of the address/command calibration test pattern signal CAxR and CAxF at the correct logic window, the memory device should correctly interpret the calibration test pattern signal. In this instance, the memory controller 20 would determine a pass P (for the relative phase of the clock CK and the address/command calibration test pattern signal CAxR and CAxF test pattern signal). If the relative phase of CK and CAxR and CAxF signals results in an incorrect interpretation of the information represented by the address/command calibration test pattern signal CAxR and CAxF, the memory controller 20 would determine a fail F.

Mapping between DQ pads and the calibrated command/address signals CAxR and CAxF for transmitting the value of the second command/address signal CA2 received by the memory device 30 to the memory controller 20 through the DQ line may be set in multiple ways. An example of mapping is shown in FIG. 8 where values of the command/address signal CAxR input by the memory device 30 at the rising edge of the clock signal CK (bits CA0 to CA9) may be output to memory device 30 DQ pads DQ[9:0] and values of the command/address signal CAxF input by the memory device 30 at the falling edges of the clock signal CK may be output to memory device DQ pads DQ[19:10]. Another example of mapping is shown in FIG. 9 where a value of a command/address signal CA9 among the command/address signals CAxR input at the rising edges of the clock signal CK may be output to a DQS pad DQS0 of the memory device 30 and values of command/address signals CA[8:0] may be output to memory device 30 DQ pads DQ[8:0]. A value of the command/address signal CA9 among the command/address signals CAxF input at the falling edges of the clock signal CK may be output to a DQS pad DQS1 of the memory device and values of the command/address signals CA[8:0] may be output to memory device DQ pads DQ[17:9].

At the memory controller 20, the relative phase between clock CK and the phase adjusted command/address signal (e.g., CAyR and CAyF) sent to the memory device 30 is altered, and a new cycle of the command/address calibration is implemented. As shown in FIG. 6, an example of an intermediate cycle of transmitting command/address calibration signals CAyR (at time $t_4$) and CAyF (at the immediately subsequent clock edge of CK) to the memory device 30 on the command/address bus 12, and sending the values interpreted by the memory device 30 to the memory controller 20 by the memory device in a manner similar to that described above with respect to CAxR and CAxF and a repetitive description here is thus unnecessary.

Just prior to time $t_5$, the clock enable signal CKE is deactivated, together with activation of the logic low level of the chip selection signal /CS. This may occur when the command/address calibration signal CAnR and CAnF (the last of n command/address calibration information sets transmitted from the memory device 30 to the controller 20 for the command/address calibration session) are transmitted from the memory controller 20 to the memory device 30 through the command/address bus 12. The command/address calibration information CAnR and CAnF may be transmitted in the same manner as transmission of the command/address calibration information CAxR and CAxF.

At a timing $t_5$, the end command/address calibration mode command is transmitted through the command/address bus 12 together with activation of the logic low level of the chip selection signal /CS. (Note that the timings illustrated in FIG. 6 for Even DQ and Odd DQ in vertical alignment with time $t_5$ occur previous to time $t_5$—see break notations in the Even DQ and Odd DQ timings.) For example, a second mode register (MRW#42) command is transmitted as the end command/address calibration mode command. If the command/address signals CA[9:0] of 10 bits are carried on the command/address bus 12, the MRW#42 command may comprise command/address signals CA[3:0] to identify the command as a mode register setting command and command/address signals CA[9:4] to identify the mode register setting command as an end command/address calibration mode command.

The MRW#42 command is input at both the rising and falling edges of the clock signal CK corresponding to the timing $t_5$. That is, the same MRW#42 command is input twice at both the rising edge of the clock signal CK at time $t_5$ and at the immediately subsequent falling edge of the clock signal CK. When an MRS command is input using the command signal at a DDR, an error may be generated such that a memory device having a high operation frequency misses the MRS command. To reduce the chances of this error, the same MRW#42 command is input twice at the rising and falling edges of the clock signal CK.

There are many ways for the memory device to determine when to latch the exit command/address calibration mode command (here, MRW#42). In one implementation, the memory device may be configured to latch the information provided on the CA bus 12 at edges of the clock signal CK having a predetermined relationship (e.g., timing) with respect to the transition of the clock enable signal CKE from the active low state to the high state. For example, as shown in FIG. 6, the memory device may be configured to latch the information provided on the CA bus 12 at the two edges of clock CK immediately following the transition of the clock enable signal CKE from the active low state to the high state. As CKE is high, the memory device 30 treats the information on the command address bus CA 12 as a command (to be processed, e.g., by a command decoder of the memory device 30) rather than as a calibration test pattern. It should be noted as well that the clock enable signal CKE may be considered active low only during certain operations, such as only during the CA calibration mode, and at other times, be interpreted as an active high signal.

After a delay of a predetermined time tMRZ from time $t_5$ at which the MRW#42 command is input, the output of the command/address signals CAnR and CAnF to the memory device DQ pads is terminated. A period from the timing $t_0$ of the clock signal CK at which the MRW#41 command, which is the command/address calibration start signal, is input to time $t_5$ of the clock signal CK at which the MRW#42 command is input plus time tMRZ may be the CA calibration period.

FIG. 7 is a truth diagram for describing an exemplary mode register command setting method.

Referring to FIG. 7, the MRW#41 command and the MRW#42 command may be set by the clock enable signal CKE, the chip selection signal /CS, and the command/address signals CA[9:0]. The MRW#41 command may act to set the MRS register (e.g., write to the MRS register) of the memory device 30 when the clock enable signal CKE is at a logic high (H) level, the chip selection signal /CS is at a logic low (L) level, the command/address signals CA[3:0] are at a logic low (L) level, and the command/address signals CA[9:4] are at logic levels of H-L-H-L-H. That is, the MRW#41 command may comprise the command/address signals CA[9:0]29H. The same MRW#41 command may be sent to the memory device twice onto the command/address bus 12 at both the rising and falling edges of the clock signal CK. The memory device 30 may be configured to set the mode register to indicate the memory device 30 is in a command/address calibration command when at least one of the two MRW#41 commands sent to the memory device 30 is properly interpreted when input by the memory device 30. (Note that sending two MRW#41 commands to the memory device 30 may comprise maintaining the command sent on the command/address bus without alteration over two logic windows of the command/address signals— which may comprise a full clock period of clock CK.)

The MRW#42 command may act to set the MRS register of the memory device 30 when the clock enable signal CKE is at a logic high level, the chip selection signal /CS is at a logic low level, the command/address signals CA[3:0] are at a logic low level, and the command/address signals CA[9:4] are at logic levels of H-L-H-L-H-L. That is, the MRW#42 command may comprise the command/address signals CA[9:0] 2AH. The same MRW#42 command may sent to the memory device twice on the command/address bus 12 at both the rising and falling edges of the clock signal CK. Herein, the command/address signals CA[9:4] may be used as mode register setting addresses MA[5:0].

FIG. 8 is a diagram showing an example for describing mapping between command/address signals and DQ pads, according to an embodiment. Since the command/address signals CA[9:0] are input at both the rising and falling edges of the clock signal CK in the current embodiment, the command/address signals CA[9:0] may be composed of 20 bits. In this regard, the bit organization of the data DQ of the memory device 30 is x32 and thus the number of DQ pads is 32. The number of DQ pads is greater than the number of command/address signals, such that the DQ pads may correspond to the command/address signals one-to-one.

Referring to FIG. 8, values of the command/address signals CA[9:0] input at the rising edges of the clock signal CK may be mapped to be output to the DQ pads DQ[9:0]. Values of the command/address signals CA[9:0] input at the falling edges of the clock signal CK may be mapped to be output to the DQ pads DQ[19:10]. For example, in FIG. 6, values of the command/address signals CAxR input at the rising edges of the clock signal CK corresponding to the timing $t_1$ are output to the DQ pads DQ[9:0], and values of the command/address signals CAxF input at the falling edges of the clock signal CK corresponding to the timing $t_1$ are output to the DQ pads DQ[19:10]. The values of the command/address signals CAxR input at the rising edges of the clock signal CK corresponding to the timing $t_4$ are output to the DQ pads DQ[9:0], and values of the command/address signals CAxF input at the falling edges of the clock signal CK corresponding to the timing $t_4$ are output to the DQ pads DQ[19:10].

FIG. 9 is a diagram showing another example for describing mapping between command/address signals and DQ and DQS pads according to another embodiment.

Referring to FIG. 9, values of the command/address signals CA[9:0] input to the memory device 30 at the rising edges of the clock signal CK (e.g. CAxR) may be mapped to be output to the DQS pads DQS0 and DQS1, and the even DQ pads DQ[0, 2, 4, 6, 8, 10, 12 and 14]. That is, the input value of the command/address signal CA9 is output to the DQS pad DQS1, the input value of the command/address signal CA4 is output to DQS0, the input values of the command/address signals CA[3:0] are respectively output to the DQ pads DQ[6,4,2,0] and the input values of the command/address signals CA[8:5] are respectively output to the DQ pads DQ[14,12,10,8].

Values of the command/address signals CA[9:0] input to the memory device 30 at the falling edges of the clock signal CK (e.g., CAxF) may be mapped to be output to the DQS pads /DQS0 and /DQS1 and the DQ pads DQ[17:9]. That is, the input value of the command/address signal CA9 may be output to the DQS pad /DQS1, the input value of CA4 may be output to DQS pad /DQS0, the input values of the command/address signals CA[3:0] are respectively output to the DQ pads DQ[7, 5, 3, 1] and the input values of the command/address signals CA[8:5] are respectively output to the DQ pads DQ[15, 13, 11 and 9].

Figure 10:
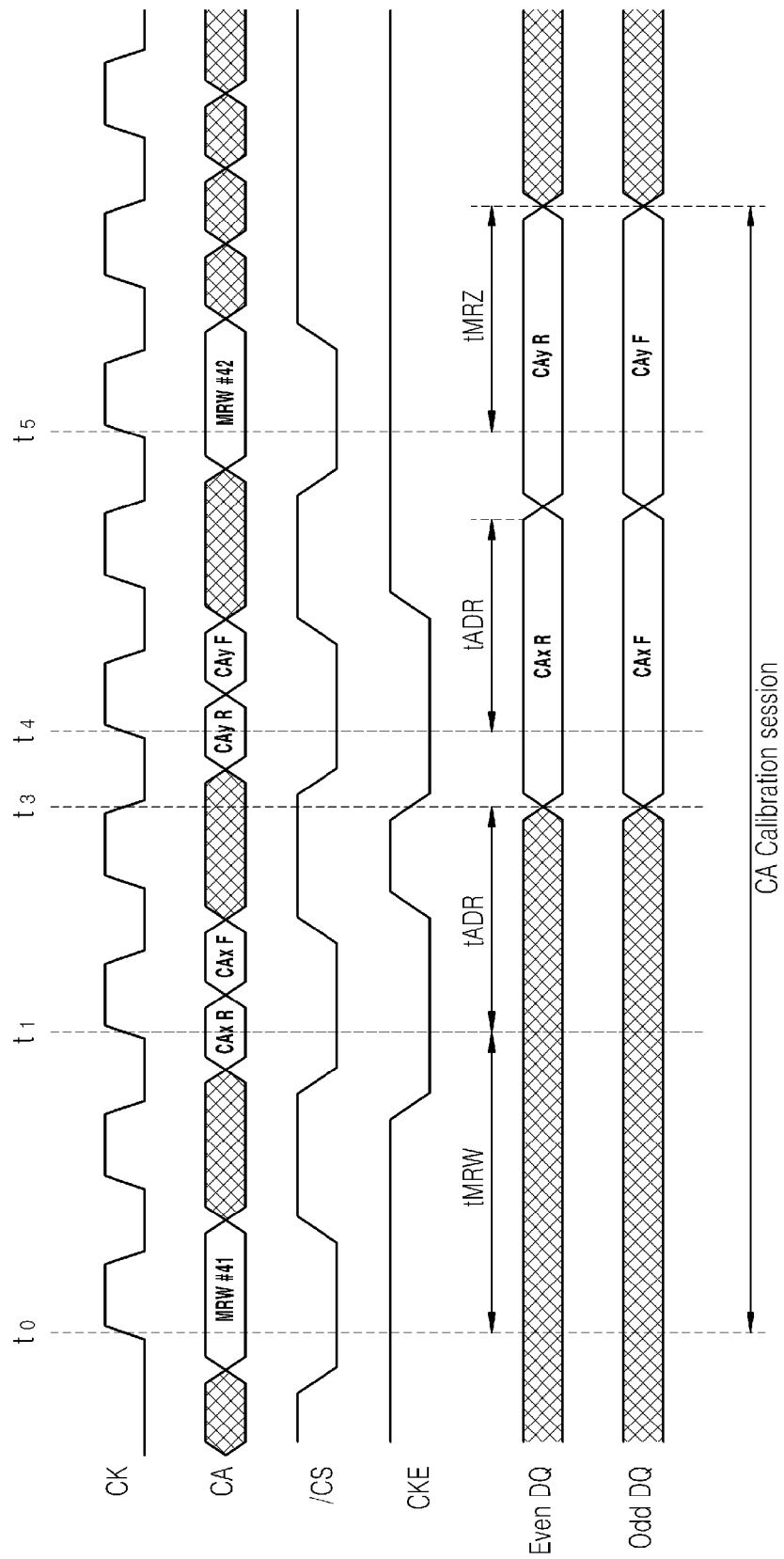
FIG. 10 is a diagram for describing a command/address calibration method according to another embodiment.

FIG. 10 is a diagram for describing a command/address calibration method according to another embodiment.

FIG. 10 is a timing diagram for describing a command/address calibration method in the memory device 30, in which the bit organization of the data DQ of the memory device 30 is x32.

Referring to FIG. 10, in conjunction with FIG. 5, the memory controller 20 generates the clock signal CK for the memory device 30. The memory controller 20 issues an enter command/address calibration mode command (or instruction) to the memory device 30 through the command/address bus 12. The enter command/address calibration mode command may be input using the particulars of the MRS command described herein with respect to other embodiments. The memory controller 20 transmits the exit command/address calibration mode command (or instruction) through the command/address bus 12. The exit command/address calibration mode command may be input using the particulars of the MRS command described herein with respect to other embodiments.

At the timing $t_0$ of the clock signal CK, the MRW#41 command, which is the enter command/address calibration command, is transmitted through the command/address bus 12, together with activation of a logic low level of the chip selection signal /CS. For example, the MRW#41 command is input at both the rising and falling edges of the clock signal CK starting at time $t_0$. That is, the same MRW#41 command may be input at the rising and falling edges of the clock signal CK starting at time $t_0$.

At the timing $t_1$, after a delay of the time tMRW from $t_0$ of the clock signal CK at which the MRW#41 command is input, the clock enable signal CKE is activated with a predetermined pulse width for one cycle of the clock signal CK, together with activation of the logic low level of the chip selection signal /CS, and the command/address signals CAxR and CAxF are transmitted in sequence through the command/address bus 12.

The command/address signals CAxR are input at the rising edge of the clock signal CK at time $t_1$, and the command/address signals CAxF are input at the falling edge of the clock signal CK at the immediately subsequent falling edge of clock CK after time $t_1$. The command/address signal CAxR and the command/address signal CAxF input through the command/address bus 12 may be different signals representing different information, such as different test pattern information.

In the calibration mode, the clock enable signal CKE acts as a read command of the command/address signals CAxR and CAxF corresponding to the value of the second command/address signal CA2 received by the memory device 30 in FIG. 5. During command/address calibration mode (and when the chip select /CS is active (logic low)), the memory device interprets an activation of the clock enable signal CKE at a logic low level as an instruction to input signals on the command/address signal bus at the subsequent edges of clock signal CK, and thus the value of the command/address signal CAxR or CAxF as received by the memory device 30 are input, e.g., as show in FIG. 10.

Starting at time $t_3$, after a delay of the time tADR from time $t_1$, the values of the command/address signals CAxR and CAxF (as interpreted/input by the memory device) are output to the DQ pads. At the timing $t_3$, the input command/address signals CAxR are output to even DQ pads and during the immediately subsequent clock edge of clock CK, the input command/address signals CAxF are output to odd DQ pads.

Mapping between the command/address signals CAxR and CAxF and the DQ pads may be set in various ways. An example of mapping is illustrated in FIG. 11 where values of the command/address signals CAxR input at the rising edges of the clock signal CK may be output to even DQ pads DQ[2n], where n is 0 to 9, and values of the command/address signals CAxF input at the falling edges of the clock signal CK may be output to odd DQ pads DQ[2n+1], where n is 0 to 9.

As another example of mapping, results of calibration on the command/address signals CA[3:0] among the command/address signals CAxR input at the rising edges of the clock signal CK may be output to even DQ pads DQ[2n], where n is 0 to 3, a value of a command/address signal CA4 may be output to the DQS pad DQS0, values of command/address signals CA[8:5] may be output to even DQ pads DQ[2n], where n is 4 to 7, and a value of the command/address signal CA9 may be output to the DQS pad DQS1. Values of the command/address signals CA[3:0] among the command/address signals CAxF input at the falling edges of the clock signal CK may be output to odd DQ pads DQ[2n+1], where n is 0 to 3, a value of the command/address signal CA4 may be output to the DQS pad /DQS0, values of command/address signals CA[8:5] may be output to odd DQ pads DQ[2n+1], where n is 4 to 7, and a value of the command/address signal CA9 may be output to the DQS pad /DQS1.

At the time $t_4$, the clock enable signal CKE is activated with the predetermined pulse width for one cycle of the clock signal CK, together with activation of the logic low level of the chip selection signal /CS, and the command/address signals CAyR and CAyF, transmitted through the command/address bus 12, are input by the memory device 30.

The command/address signals CAyR are input at the rising edges of the clock signal CK at time $t_4$ and the command/address signals CAyF are input at the falling edges of the clock signal CK (at the immediately subsequent clock edge of clock CK after time $t_4$). The command/address signal CAyR and the command/address signal CAyF input through the command/address bus 12 may be different signals (e.g., different sets of bits of the test pattern).

In the calibration mode, the clock enable signal CKE acts as a read command of the command/address signals CAyR and CAyF, and thus when the clock enable signal CKE is activated at a logic low level, the values of the command/address signals CAyR and CAyF received by the memory device 30 are output to the even DQ pads and the odd DQ pads are input by the memory device 30 at a timing responsive to clock CK.

After a delay of the predetermined time tADR from time $t_4$ of the clock signal CK, the values of the command/address signals CAyR and CAyF (as input by the memory device starting at time $t_4$) are output to the DQ pads. That is, the command/address signals CAyR as input by the memory device 30 are output to even DQ pads and the command/address signals CAyF as input by the memory device 30 are output to odd DQ pads.

When the memory device 30 transmits the command/address signals CAyR and CAyF to the memory controller 20, mapping with the DQ pads may be set variously. As an example of mapping, values of the command/address signals CAyR input at the rising edges of the clock signal CK may be output to even DQ pads DQ[2n], where n is 0 to 9, and values of the command/address signals CAyF input at the falling edges of the clock signal CK may be output to odd DQ pads DQ[2n+1], where n is 0 to 9.

As another example of mapping, values of the command/address signals CA[3:0] among the command/address signals CAyR input at the rising edges of the clock signal CK may be output to even DQ pads DQ[2n], where n is 0 to 3, a value of a command/address signal CA4 may be output to the DQS pad DQS0, values of command/address signals CA[8:5] may be output to even DQ pads DQ[2n], where n is 4 to 7, and a value of the command/address signal CA9 may be output to the DQS pad DQS1. Values of the command/address signals CA[3:0] among the command/address signals CAyF input at the falling edges of the clock signal CK may be output to odd DQ pads DQ[2n+1], where n is 0 to 3, a value of the command/address signal CA4 may be output to the DQS pad /DQS0, values of the command/address signals CA[8:5] may be output to odd DQ pads DQ[2n+1], where n is 4 to 7, and a value of the command/address signal CA9 may be output to the DQS pad /DQS1.

At time $t_5$, the MRW#42 command, which is an exit command/address calibration mode command, is transmitted through the command/address bus 12 together with activation of the logic low level of the chip selection signal /CS. In this example, the MRW#42 command is input at both the rising and falling edges of the clock signal CK corresponding to the timing $t_5$. That is, the same MRW#42 command is input at the rising and falling edges of the clock signal CK corresponding to the time $t_5$.

There are many ways for the memory device 30 to recognize the signals on the command/address bus 12 as a command (rather than another set of test pattern calibration information for a new cycle). For instance, there may be a predetermined number of cycles of test pattern information sent to the memory device after which the memory device 30 expects to receive a command; the memory device 30 may count the number of cycles of test pattern information and when the count reaches the predetermined number (or one before or one after, e.g.) expect to receive a command. Alternatively, the memory device 30 may monitor all information input via the command/address bus 12 (monitor command/address calibration information $C_r$, e.g.) to detect a predetermined code (e.g., a command code) and when the predetermined code is detected (and/or recognized as the exit command/address calibration command code) exit the calibration mode, or otherwise treat the input information as calibration information resulting from the test pattern transmission during a cycle of the calibration mode.

After a delay of the predetermined time tMRZ from time $t_5$ at which the MRW#42 command is input, the output of the calibrated command/address signals CAyR to the DQ pads is terminated. A period from the time $t_0$ (at which the MRW#41 command, which is the enter command/address calibration mode command, is input, to time $t_5$, at which the MRW#42 command, which is the exit command/address calibration mode command, is input plus time tMRZ may correspond to a CA calibration mode period.

Although FIG. 10 shows only two sets of test patterns sent during the calibration mode period (pair CAxR and CAxF and pair CAyR and CAyF), more than two sets of test patterns may be sent during a calibration period. In addition, FIG. 10 illustrates the logic windows of the command/address calibration signals positioned to have its logic window center correspond to the corresponding clock edges of clock CK. However, this is for description purposes only; it is contemplated that the controller 20 will alter the relative phase for each of the command/address calibration signals (representing the calibration test patterns) so that the timing of the clock edge CK for many of the command/address calibration signals will be shifted in time (and may be of a timing which is shifted—such as outside of—with respect to the center of the command/address calibration signal logic window so that the memory device 30 incorrectly interprets the command/address calibration signal logic).

FIG. 11 is a table showing an example for describing mapping between command/address signals and DQ pads according to another embodiment.

Referring to FIG. 11, values of the command/address signals CA[9:0] input at the rising edges of the clock signal CK may be mapped to be output to even DQ pads DQ[2n], where n is 0 to 9. Values of the command/address signals CA[9:0] input at the falling edges of the clock signal CK may be mapped to be output odd DQ pads DQ[2n+1], where n is 0 to 9. For example, in FIG. 10, values of the command/address signals CAxR input at the rising edges of the clock signal CK corresponding to the timing $t_1$ may be output to even DQ pads DQ[2n], where n is 0 to 9, and values of the command/address signals CAxF input at the falling edges of the clock signal CK may be output to odd DQ pads DQ[2n+1], where n is 0 to 9. Values of the command/address signals CAxR input at the rising edges of the clock signal CK at time $t_4$ may be output to even DQ pads DQ[2n], where n is 0 to 9, and values of the command/address signals CAxF input at the falling edges of the clock signal CK may be output to odd DQ pads DQ[2n+1], where n is 0 to 9.

FIG. 12 is a table showing another example for describing mapping between command/address signals and DQ pads of memory device 30 according to another embodiment Referring to FIG. 12, values of the command/address signals CA[9:0] input to the memory device 30 at the rising edges of the clock signal CK (e.g., CAxR) may be mapped to be output to the DQS pad DQS0 and the DQ pads DQ[8:0]. That is, the value of the command/address signal CA9 may be output to the DQS pad DQS0, and the values of the command/address signals CA[8:0] are output to the DQ pads DQ[8:0].

Values of the command/address signals CA[9:0] input to the memory device 30 at the falling edges of the clock signal CK (e.g., CAxF) may be mapped to be output to the DQS pad DQS1 and the DQ pads DQ[17:9]. That is, the value of the command/address signal CA9 may be output to the DQS pad DQS1 and the values of the command/address signals CA[8:0] may be output to the DQ pads DQ[17:9].

Figure 13:
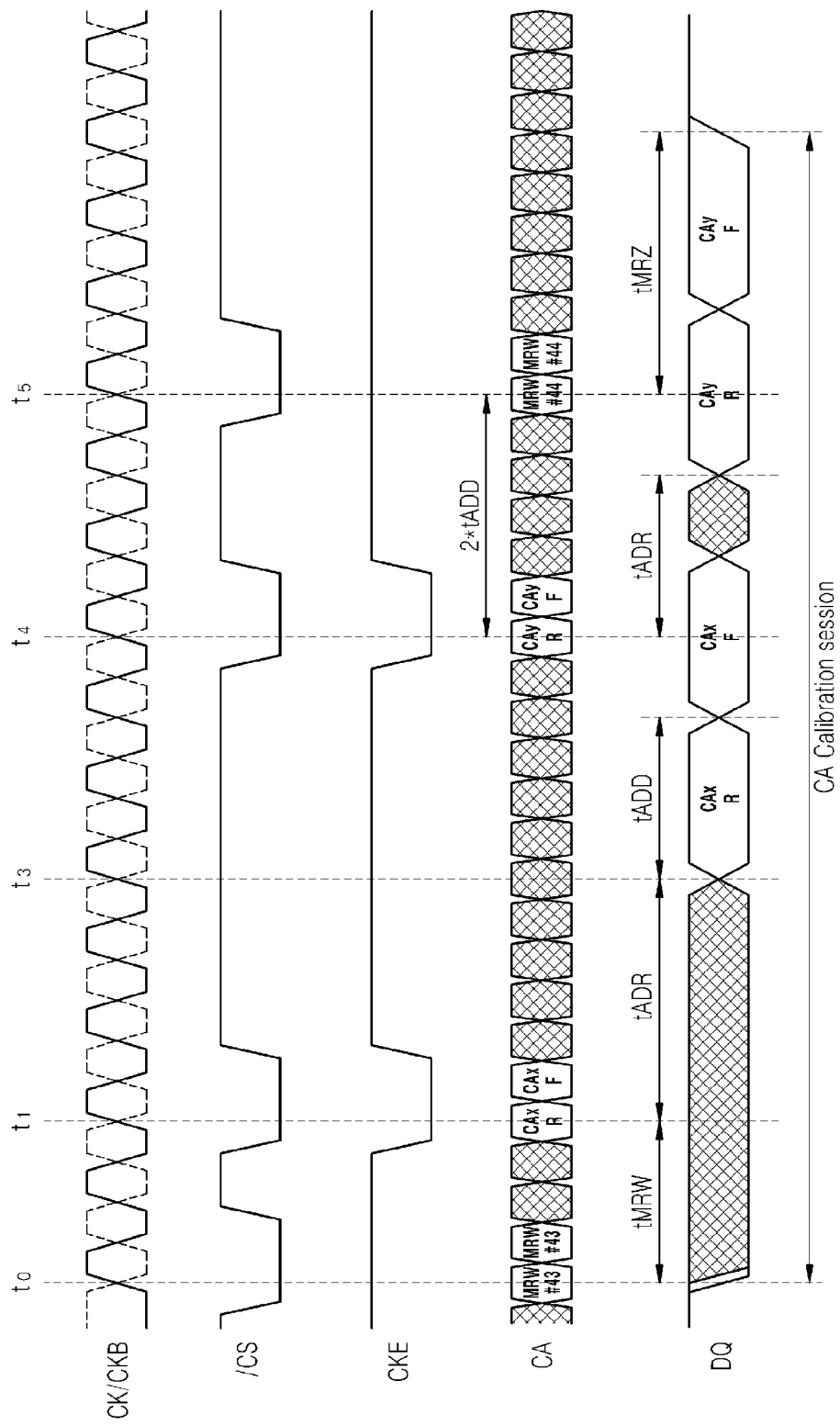
FIG. 13 is a diagram for describing a command/address calibration method according to another embodiment.

FIG. 13 is a timing diagram describing a command/address calibration method in the memory device 30 according to another embodiment. The bit organization of the data DQ of the memory device 30 is 16×. In the current embodiment, the command/address signals CA[9:0] are input at both the rising and falling edges of the clock signal CK, and thus, each command/address test pattern CA[9:0] may be composed of 20 bits. In this regard, since the bit organization of the data DQ of the memory device 30 is x16, the number of DQ pads is 16. The number of command/address test pattern bits sent with respect to a particular relative phase generated by the memory controller 20 is greater than the number of DQ pads, such that the DQ pads cannot uniquely correspond to the command/address signals. As a result, the DQ pads may be allocated to the command/address signals received on different signal lines of the command/address bus 12 at predetermined time intervals.

Referring to FIG. 13, in conjunction with FIG. 5, the memory controller 20 generates the clock signal CK for the memory device 30. The memory controller 20 sends an enter command/address calibration mode command (or instruction) to the memory device 30 through the command/address bus 12. The enter command/address calibration mode command may use the particular MRS command format described elsewhere herein. The memory controller 20 transmits the exit command/address calibration mode command through the command/address bus 12. The exit command/address calibration mode command may use the particular MRS command format described elsewhere herein.

At time $t_0$, the enter command/address calibration mode command is transmitted through the command/address bus 12, together with activation of a logic low level of the chip selection signal /CS. For example, a third mode register (MRW#43) command is transmitted as the command/address calibration start signal. When command/address signals CA[9:0] of 10 bits are carried on the command/address bus 12, the MRW#43 command may be a mode register setting command comprising command/address signals CA[3:0] indicating the command is a mode register setting command and command/address signals CA[9:4] indicting the mode register setting command is an enter calibration mode command.

The MRW#43 command is input at both the rising and falling edges of the clock signal CK starting at time $t_0$. That is, the same MRW#43 command is input at the rising edge of the clock signal CK at time $t_0$ and again at the immediately subsequent falling edge of clock signal CK. This is because an error may be generated such that a memory device having a high operation frequency (e.g., during a DDR operation) misses or misinterprets the MRS command. To reduce the chance of this error, the same MRW#43 command is input at the rising and falling edges of the clock signal CK corresponding to the timing $t_0$.

At time $t_1$ after a delay of the predetermined time tMRW from time $t_0$ of the clock signal CK at which the MRW#43 command is input, the clock enable signal CKE is activated with a predetermined pulse width for one cycle of the clock signal CK, together with activation of the logic low level of the chip selection signal /CS, and command/address signals CAxR and CAxF are transmitted through the command/address bus 12. The time tMRW may be a mode register set write cycle time.

The command/address signals CAxR are input at the rising edge of the clock signal CK at time $t_1$, and the command/address signals CAxF are input at the falling edge of the clock signal CK at the immediately subsequent falling edge of clock signal CK after $t_1$. The command/address signal CAxR and the command/address signal CAxF input through the command/address bus 12 may be different signals. For example, when the command/address bus 12 is composed of command/address signals CA[9:0] of 10 bits, the command/address signal CAxR of 10 bits and the command/address signal CAxF of 10 bits may be distinguished as different signals. Thus, the command/address signals CA[9:0] of 20 bits may be input to the memory device 30 through command/address terminals (such as pads, pins or bumps—not shown) of the memory device 30 connected with the command/address bus 12 of 10 bits.

As there is a demand for the memory device 30 to have a large capacity, the degree of integration and the number of memory cells increase. As the number of memory cells increases, the number of address bits for addressing the memory cells also increases. The increase in the number of address pins leads to the increase in chip size. Therefore, a method for suppressing the increase in the number of address pins required most in the memory chip is desired. Since command/address signals are input at both rising and falling edges of a clock signal in the current embodiment, the number of command/address pins of the memory device 30 may be reduced.

During command/address calibration mode, the clock enable signal CKE acts as a read command of the command/address signals CAxR and CAxF. When the clock enable signal CKE is activated at a logic low level, the command/address signals CAxR and CAxF are input at a timing responsive to the clock CK, and results thereof are output as a data signal DQ. Thus, the clock enable signal CKE is used as a pseudo command.

After a delay of the predetermined time tADR from time $t_1$, the command/address signals CAxR and CAxF as input by the memory device 30 are output as a data signal DQ. The time tADR may be a set delay time from activation of the clock enable signal CKE to data output to DQ pads.

At time $t_3$, the calibrated command/address signal CAxR as input by the memory device 30 is output via the DQ pads of the memory device 30. At time $t_4$, after the calibrated command/address signal CAxR is output to the DQ pad for a predetermined time tADD, the calibrated command/address signal CAxF as input by the memory device 30 is output via the DQ pads of the memory device 30.

Mapping between the calibrated command/address signals CAxR and CAxF and DQ pads may be set in various ways. As an example of mapping, values of the command/address signals CAxR input at rising edges of the clock signal CK may be output to the DQ pads DQ[9:0] and then values of the command/address signals CAxF input at falling edges of the clock signal CK may be output to the DQ pads DQ[9:0].

As another example of mapping, values of command/address signals CA[4:0] among the command/address signals CAxR input at the rising edges of the clock signal CK are output to DQ pads DQ[4:0] and then results of calibration on command/address signals CA[9:5] are also output to the DQ pads DQ[4:0]. Values of the command/address signals CA[4:0] among the command/address signals CAxF input at the falling edges of the clock signal CK are output to DQ pads DQ[9:5] and then results of calibration on the command/address signals CA[9:5] are also output to the DQ pads DQ[9:5].

As still another example of mapping, values of command/address signals CA[3:0] among the command/address signals CAxR input at the rising edges of the clock signal CK are output to DQ pads DQ[3:0], a value of a command/address signal CA4 is output to a DQS pad DQS0, values of command/address signals CA[8:5] are output to the DQ pads DQ[4:0], and a value of a command/address signal CA9 is output to a DQS pad DQS1. Values of the command/address signals CA[3:0] among the command/address signals CAxF input at the falling edges of the clock signal CK are output to DQ pads DQ[7:4], a value of the command/address signal CA4 is output to a DQS pad /DQS0, values of the command/address signals CA[8:5] are output to the DQ pads DQ[7:4], and a value of the command/address signal CA9 is output to a DQS pad /DQS1.

Starting at time $t_4$, the clock enable signal CKE is activated with the predetermined pulse width for one cycle of the clock signal CK, together with activation of the logic low level of the chip selection signal /CS, and the command/ address signals CAyR and CAyF are transmitted through the command/address bus 12 from the memory controller 20 to the memory device 30.

The command/address signals CAyR are input at the rising edge of the clock signal CK at time $t_4$ and the command/address signals CAyF are input at the immediately subsequent falling edge of the clock signal CK. The command/address signal CAyR and the command/address signal CAyF input through the command/address bus 12 may be different signals.

After a delay of the predetermined time tADR from time $t_4$ the command/address signals CAyR and CAyF as input by the memory device 30 are output via the DQ pads to the DQ bus 13. After the calibrated command/address signals CAyR (as input by the memory device 30) are output to the DQ pads, the calibrated command/address signals CAyF (as input by the memory device 30) are output.

Mapping between the calibrated command/address signals CAyR and CAyF and the DQ pads may be set various ways. As an example of mapping, values of the command/address signals CAyR input at the rising edges of the clock signal CK may be output to the DQ pads DQ[9:0], and then values of the command/address signals CAyF input at the falling edges of the clock signal CK may be output to the DQ pads DQ[9:0].

As another example of mapping, values of the command/address signals CA[4:0] among the command/address signals CAxR input at the rising edges of the clock signal CK are output to the DQ pads DQ[4:0] and then results of calibration on command/address signals CA[9:5] are also output to the DQ pads DQ[4:0]. Values of the command/address signals CA[4:0] among the command/address signals CAxF input at the falling edges of the clock signal CK are output to DQ pads DQ[9:5] and then results of calibration on the command/address signals CA[9:5] are also output to the DQ pads DQ[9:5].

As still another example of mapping, values of the command/address signals CA[3:0] among the command/address signals CAxR input at the rising edges of the clock signal CK are output to the DQ pads DQ[3:0], a value of the command/address signal CA4 is output to the DQS pad DQS0, values of the command/address signals CA[8:5] are output to the DQ pads DQ[4:0], and a value of the command/address signal CA9 is output to the DQS pad DQS1. Values of the command/address signals CA[3:0] among the command/address signals CAxF input at the falling edges of the clock signal CK are output to the DQ pads DQ[7:4], a value of the command/address signal CA4 is output to the DQS pad /DQS0, values of the command/address signals CA[8:5] are output to the DQ pads DQ[7:4], and a value of the command/address signal CA9 is output to the DQS pad /DQS1.

At time $t_5$, the exit calibration/address calibration mode command is transmitted through the command/address bus 12 together with activation of the logic low level of the chip selection signal /CS. For example, a fourth mode register (MRW#44) command is transmitted as the command/address calibration end signal. When the command/address signals CA[9:0] of 10 bits are carried on the command/address bus 12, the MRW#44 command may be set by a mode register setting command which may comprise CA[3:0] to indicate the command is a mode register setting command and command/address signals CA[9:4] to indicate the mode register setting command is an exit command/address calibration mode command.

The MRW#44 command may be input at both the rising and falling edges of the clock signal CK corresponding to the timing $t_5$. That is, the same MRW#44 command is input at both the rising and falling edges of the clock signal CK starting at time $t_5$. After a delay of the predetermined time tMRZ from the timing $t_5$ of the clock signal CK at which the MRW#44 command is input, the output of the calibrated command/address signals CAyR via the DQ pads is terminated. A period from the timing $t_0$ at which the $MR_w$#41 command is input to the timing $t_5$ CK at which the MRW#44 command is input plus tMRZ may be a CA calibration period.

Although FIG. 13 shows only two sets of test patterns sent during the calibration mode period (pair CAxR and CAxF and pair CAyR and CAyF), more than two sets of test patterns may be sent during a calibration period. In addition, FIG. 13 illustrates the logic windows of the command/address calibration signals positioned to have its logic window center correspond to the corresponding clock edges of clock CK. However, this is for description purposes only; it is contemplated that the controller 20 will alter the relative phase for each of the command/address calibration signals (representing the calibration test patterns) so that the timing of the clock edge CK for many of the command/address calibration signals will be shifted in time (and may be of a timing which is shifted—such as outside of—with respect to the center of the command/address calibration signal logic window so that the memory device 30 incorrectly interprets the command/address calibration signal logic).

FIG. 14 is a table for describing a mode register command setting method according to another embodiment.

Referring to FIG. 14, the MRW#43 command and the MRW#44 command may be set by the clock enable signal CKE, the chip selection signal /CS, and the command/address signals CA[9:0]. The MRW#43 command may be set when the clock enable signal CKE is at a logic high level, the chip selection signal /CS is at a logic low level, the command/address signals CA[3:0] are at a logic low level, and the command/address signals CA[9:4] are respectively at logic levels of H-L-H-L-H-H. That is, the MRW#43 command may be represented by a command/address signal CA[9:0] value of 2BH. The MRW#43 command may be identical at both the rising and falling edges of the clock signal CK as noted above, however, a different value (such as the inverse of 2BH) may be sent to the memory device 30 instead.

The MRW#44 command may be set when the clock enable signal CKE is at a logic high level, the chip selection signal /CS is at a logic low level, the command/address signals CA[3:0] are at a logic low level, and the command/address signals CA[9:4] are respectively at logic levels of H-L-H-H-L-L. That is, the MRW#44 command may be set identically at both the rising and falling edges of the clock signal CK. Herein, the command/address signals CA[9:4] may be used as mode register setting addresses MA[5:0].

FIG. 15 is a diagram showing an example for describing mapping between command/address signals and DQ pads of the memory device 30 according to another embodiment.

Referring to FIG. 15, values of the command/address signals CA[9:0] input at the rising edges of the clock signal CK may be mapped to be output to the DQ pads of the memory device 30 DQ[9:0]. Thereafter, results of calibration on the command/address signals CA[9:0] input at the falling edges of the clock signal CK may be mapped to be output to the DQ pads DQ[9:0]. For example in FIG. 13, the values of the command/address signals CAxR input at the rising edges of the clock signal CK corresponding to time $t_1$ may be mapped to be output to the DQ pads DQ[9:0], and then the values of the command/address signals CAxF input at the falling edges of the clock signal CK corresponding to time $t_1$ may be mapped to be output to the DQ pads DQ[9:0]. The values of the command/address signals CAyR input at the rising edges of the clock signal CK corresponding to time $t_4$ may be mapped to be output to the DQ pads DQ[9:0], and then the values of the command/address signals CAyF input at the falling edges of the clock signal CK corresponding to time $t_4$ may be mapped to be output to the DQ pads DQ[9:0].

FIG. 16 is a diagram showing another example for describing mapping between command/address signals and DQ pads of the memory device 30 according to another embodiment.

Referring to FIG. 16, portions of the values of the command/address signals CA[9:0] input at the rising edges of the clock signal CK may be sequentially mapped to be output to the DQ pads DQ[4:0] at predetermined time intervals. Portions of the values of the command/address signals CA[9:0] input at the falling edges of the clock signal CK may be sequentially mapped to be output to the DQ pads DQ[5:9] at predetermined time intervals.

For example, in FIG. 13, after the values of the command/address signals CA[9:0] of the command/address signals CAxR and CAxF are respectively input at the rising edge and falling edge of the clock signal CK at time $t_1$, the values CA[4:0] of CAxR (as input) may be output respectively via the DQ pads DQ[4:0] followed at a later time by an output of the values CA[9:5] of CAxR (as input) output respectively via DQ pads DQ[4:0]. Then, the values of the command/address signals CA[4:0] of CAxF (as input) are output via the DQ pads DQ[9:5], followed by the values of the command/address signals CA[9:5] of CAxF (as input) being output via the DQ pads DQ[9:5].

FIG. 17 is a diagram showing another example of mapping between command/address signals and DQ pads according to another embodiment.

Referring to FIG. 17, portions of the input values of the command/address signals CA[9:0] input at the rising edges of the clock signal CK may be sequentially output to the DQS pads DQS0 and DQS1 and the DQ pads DQ[3:0]. For example, the values of the command/address signals CA[3:0] of CAxR are output via the DQ pads DQ[3:0], with the value of the command/address signal CA4 of CAxR output via the DQS pad DQS0. Then, the values of the command/address signals CA[8:5] of CAxR are output via the DQ pads DQ[3:0], with the value of the command/address signal CA9 being output via the DQS pad DQS1.

Portions of the input values of the command/address signals CA[9:0] input at the falling edges of the clock signal CK may be sequentially output to the DQS pads /DQS0 and /DQS1 and the DQ pads DQ[7:4]. For example, after outputting the portions of CAxR as described above, the values of the command/address signals CA[3:0] of CAxF are output via the DQ pads DQ[7:4], the value of the command/address signal CA4 of CAxF is output via the DQS pad /DQS0, the values of the command/address signals CA[8:5] of CAxF are output via the DQ pads DQ[7:4], and the value of the command/address signal CA9 of CAxF is output via the DQS pad /DQS1.

Figure 18:
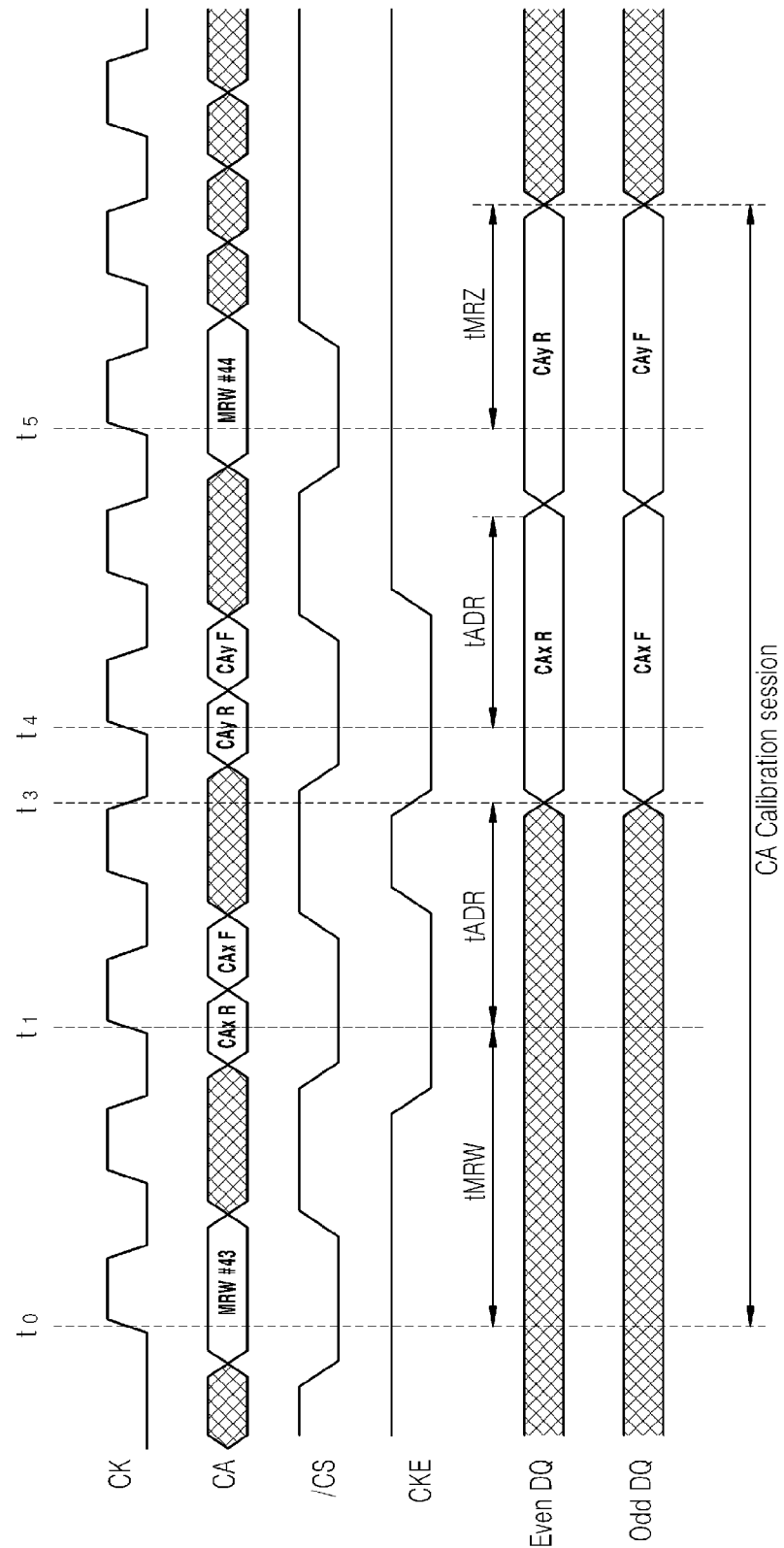
FIG. 18 is a diagram for command/address calibration method according to another embodiment.

FIG. 18 is a diagram of an exemplary command/address calibration method according to another embodiment. FIG. 18 is a timing diagram describing a command/address calibration method in the memory device 30 shown in FIG. 5, in which the bit organization of the data DQ of the memory device 30 is 16x. The method represented by FIG. 18 may be the same as that described above with respect to FIG. 10 or its alternatives, except that it may differ in the output of the command/address calibration information from the memory device 30 to the memory controller 20. In addition, FIG. 18 illustrates an option of using the specific example of MRW#43 as an enter command/address calibration mode command and the specific example of MRW#44 as an exit command/address calibration mode command. As the timing and operation of the memory system 10 of the embodiment of FIG. 10 and its alternatives has been described above, a repetitive description of the shared features of the embodiments of FIG. 10 and FIG. 18 need not be repeated here. Mapping between the input command/address signals CAxR and CAxF and the DQ pads may be set variously. As an example of mapping, portions of values of the command/address signals CAxR input at the rising edges of the clock signal CK may be sequentially output to even DQ pads DQ[2n] at predetermined time intervals, and portions of values of the command/address signals CAxF input at the falling edges of the clock signal CK may be sequentially output to odd DQ pads DQ[2n+1] at predetermined time intervals, where n is 0 to 4. An example of this is described further with respect to FIG. 19.

As another example of mapping, the values of the command/address signals CA[3:0] of CAxR input at the rising edges of the clock signal CK are respectively output to the even DQ pads DQ[2n], where n is 3 to 0, while the value of the command/address signal CA4 of CAxR is output to the DQS pad DQS0, while the values of the command/address signals CA[8:5] of CAxR are respectively output to the even DQ pads DQ[2n], where n is 8 to 5, and while the value of the command/address signal CA9 of CAxR is output to the DQS pad DQS1. At the same time, the values of the command/address signals CA[3:0] of CAxF are respectively output to the odd DQ pads DQ[2n+1], where n is 3 to 0, while the value of the command/address signal CA4 of CAxF is output to the DQS pad /DQS0, while the values of the command/address signals CA[8:5] of CAxF are respectively output to the odd DQ pads DQ[2n+1], where n is 8 to 5, and while the value of the command/address signal CA9 is output to the DQS pad /DQS1. In this embodiment and all other embodiments described herein, mapping and output of the other values of the command/address signals corresponding to later calibration cycles (e.g., other CAnR and CAnF, such as CAyR and CAyF) to the outputs of the memory device may be made in a manner as described above with respect to CAxR and CAxF, although this is not necessary. In addition, while the mapping and output has been described above with respect to terminals (e.g., pads, pins, bumps, etc.) of the memory device 30, for all embodiments described herein, these descriptions are equally applicable to associated buses and signal lines providing communications between the memory device 30 and memory controller 20, as well as to the terminals (pads, pins, bumps, etc.) of the memory controller. For example, a description of an output of certain command address information (or values) to even DQ pads of the memory device 30 in a certain embodiment contemplates the transmission of that command address information (or values) via corresponding even DQ lines of DQ bus 13 and receipt by corresponding even DQ terminals by memory controller 20.

FIG. 19 is a diagram showing an example of mapping between command/address signals and DQ pads according to an embodiment.

Referring to FIG. 19, portions of the values of the command/address signals CA[9:0] input at the rising edges of the clock signal CK may be sequentially output to the even DQ pads DQ[2n], where n is 0 to 4. Portions of the values of the command/address signals CA[9:0] input at the falling edges of the clock signal CK may be sequentially output to the odd DQ pads DQ[2n+1], where n is 0 to 4. For example, in FIG. 10, the values of the command/address signals CA[0:4] of CAxR input at the rising edges of the clock signal CK corresponding to the timing $t_1$ may be output to the even DQ pads DQ[2n] while the values of the command/address signals CA[0:4] of CAxF input at the falling edges of the clock signal CK may be output to the odd DQ pads DQ[2n+1], where n is 0 to 4. At a subsequent time (which may immediately after this output), the values of the command/address signals CA[5:9] of CAxR may be output to the even DQ pads DQ[2n], and the values of the command/address signals CA[5:9] of CAxF may be output to the odd DQ pads DQ[2n+1], where n is 0 to 4. At a later time, calibration information associated with other calibration cycles may be output in a similar manner, such as CAyF and CAyR described with respect to FIG. 10.

FIG. 20 is a diagram showing another example for describing mapping between command/address signals and DQ pads according to an embodiment.

Referring to FIG. 20, the values of the command/address signals CA[9:0] input at the rising edges of the clock signal CK (e.g., CAxR) may be mapped to be output to the DQS pads DQS0 and DQS1 and the even DQ pads DQ[2n], where n is 0 to 3. For example, the values of the command/address signals CA[0:3] of CAxR are output to the even DQ pads DQ[2n] while the value of the command/address signal CA4 of CAxR is output to the DQS pad DQS0 (where n is 0 to 3). Then, the values of the command/address signals CA[5:8] of CAxR are output to the even DQ pads DQ[2n] while the value of the command/address signal CA9 of CAxR is output to the DQS pad DQS1 (where n is 0 to 3).

The values of the command/address signals CA[9:0] input at the falling edges of the clock signal CK (e.g., CAxF) may be mapped to be output to the DQS pads /DQS0 and /DQS1 and the odd DQ pads DQ[2n+1], where n is 0 to 3. For example, the values of the command/address signals CA[0:3] of CAxF are output to the odd DQ pads DQ[2n+1] while the value of the command/address signal CA4 of CAxF is output to the DQS pad /DQS0. Then, the values of the command/address signals CA[5:8] of CAxF are output to the odd DQ pads DQ[2n+1] while the value of the command/address signal CA9 of CAxF is output to the DQS pad /DQS1. The output of CA[4:0] of CAxR and CA[4:0] of CAxF may occur at the same time. The output of CA[5:9] of CAxR and CA[5:9] of CAxF may occur at the same time. At a later time, calibration information associated with other calibration cycles may be output in a similar manner, such as CAyF and CAyR described with respect to FIG. 10.

Figure 21:
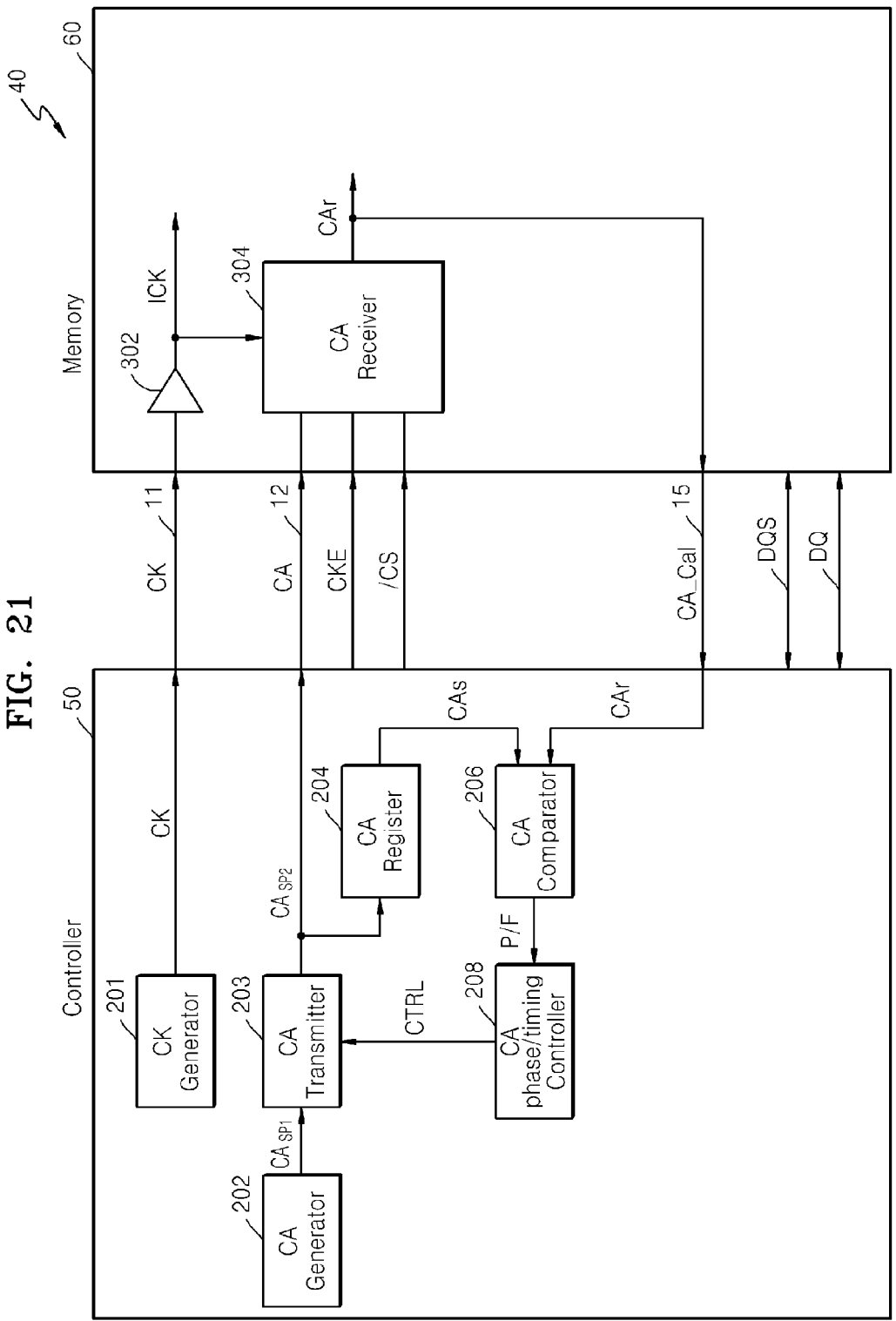
FIG. 21 is a block diagram showing another example of a memory system which may be used to implement one or more command/address calibration embodiments described herein.

FIG. 21 is a block diagram showing another example of a memory system that may be used to implement one or more CA calibration embodiments described herein.

Referring to FIG. 21, the memory system 40 is different from the memory system 10 shown in FIG. 5 in that the command/address calibration information $CA_r$ (the phase adjusted calibration signal $CA_{sp2}$ from the controller 50, as interpreted by memory device 60) is provided to memory controller 50 through a separate calibration bus CA_Cal 15 instead of the DQ bus 13. The calibration bus CA_Cal 15 may be dedicated to transmitting received command/address information $CA_r$ during the calibration mode. When not in the calibration mode (during normal operation), the calibration bus CA_Cal 15 may be used for another function, or may be unused. For example, calibration bus CA_Cal 15 may be used to transmit DQ calibration information from the memory device 60 to the memory controller 50 during a DQ bus calibration mode. The DQ calibration may be the same as that described herein with respect to any of the CA calibration embodiments and the DQ calibration information may be same as the CA calibration information, except that the calibration is performed with calibration signals transmitted over the DQ bus, and thus a repetitive description need not be made here. Therefore, other signals may be transmitted through a DQ signal line and a DQS signal line, which are additional lines, during calibration of command/address signals, thereby improving efficiency. To avoid a repetitive description, a detailed description of the same components as in FIG. 5 will not be provided.

In the memory controller 50, the clock generator 201 generates a clock signal CK to provide the clock signal CK to the memory device 60 through the clock signal line 11. The CA transmitter 203 adjusts the phase or timing of the initial command/address signal $CA_{sp1}$ in response to the control signal CTRL of the phase/timing controller 208 to generate the phase adjusted command/address signal $CA_{sp2}$.

In the memory device 60, the CA receiver 304 receives the phase adjusted command/address signal $CA_{sp2}$ at a timing responsive to the internal clock signal ICK and as enabled by the clock enable signal CKE and chip select signal /CS to generate the command/address calibration information $CA_r$. The command/address calibration information $CA_r$ is provided by the memory device 60 to the memory controller 50 through the calibration bus CA_Cal 15. Through the calibration bus CA_Cal 15, the command/address calibration information $CA_r$ is provided to the comparator 206 of the memory controller 50.

The comparator 206 of the memory controller 50 compares sent command/address information $CA_s$ (which may be data of the information of the phase adjusted command/address signal $CA_{sp2}$—which may be the same as the information of initial command/address signal $CA_{sp1}$) with the received command/address calibration information $CA_r$ to generate the pass signal P or the fail signal F. The phase/timing controller 208 generates the control signal CTRL instructing a phase shift of the phase adjusted command/address signal $CA_{sp2}$ according to the pass signal P or the fail signal F generated by the comparator 206. The CA transmitter 203 generates the phase-adjusted command/address signal $CA_{sp2}$ according to the control signal CTRL. During a calibration of the command/address communications between the memory device 60 and the memory controller 50, multiple cycles of sending phase adjusted command/address signals $CA_{sp2}$, each with a different adjusted relative phase with respect to clock CK, may be performed, and the optimum relative phase between clock CK and command/address signals sent to memory device 60 from memory controller 50 may be chosen based on multiple pass P and fail F determinations, as described herein with respect to other embodiments (such as those describing memory controller 20 and memory device 30 of FIG. 5). For example, by repetition of the CA calibration cycle, the phase/timing controller 208 of the memory controller 50 determines an optimum relative phase of the clock CK with one, plural or all of the command/address signals to trigger input (e.g., latching) of by the memory device 60 at the middle of the command/address signal CA window. Thus, the memory device 60 receives the command/address signal CA for which the middle of an effective window corresponds to rising and falling edges of the clock signal CK, which may be the rising and falling edges of both of the clock signals CK and CKB.

Like other embodiments described herein, calibration may be performed for a single command/address signal line CA (which calibration may be used to determine a single optimum relative phase for all signal lines of a command/address bus 12), for some but not all of the command/address signal lines of the command/address bus 12 or for all of the command/address signal lines of the command/address bus 12 (either individually or as a group). The results may be used to determine and control the relative phase between clock CK and the signal lines of the command/address bus 12 either as a single group (e.g., all of the signal lines of the command address bus send signals having the same optimum relative phase with clock CK), plural groups (i.e., each of the groups of signal lines of the command/address bus 12 have a corresponding optimum relative phase determined by the memory controller 50 and may share circuitry to achieve such determined optimum relative phase during normal operation—such as the CA phase/timing controller 208, or individually (e.g., each of the signal lines of the command/address bus 12 have a corresponding optimum relative phase determined by the memory controller 50 and may have dedicated (not shared) circuitry to achieve such determined optimum relative phase during normal operation, such as a dedicated CA phase/timing controller 208).

Figure 22:
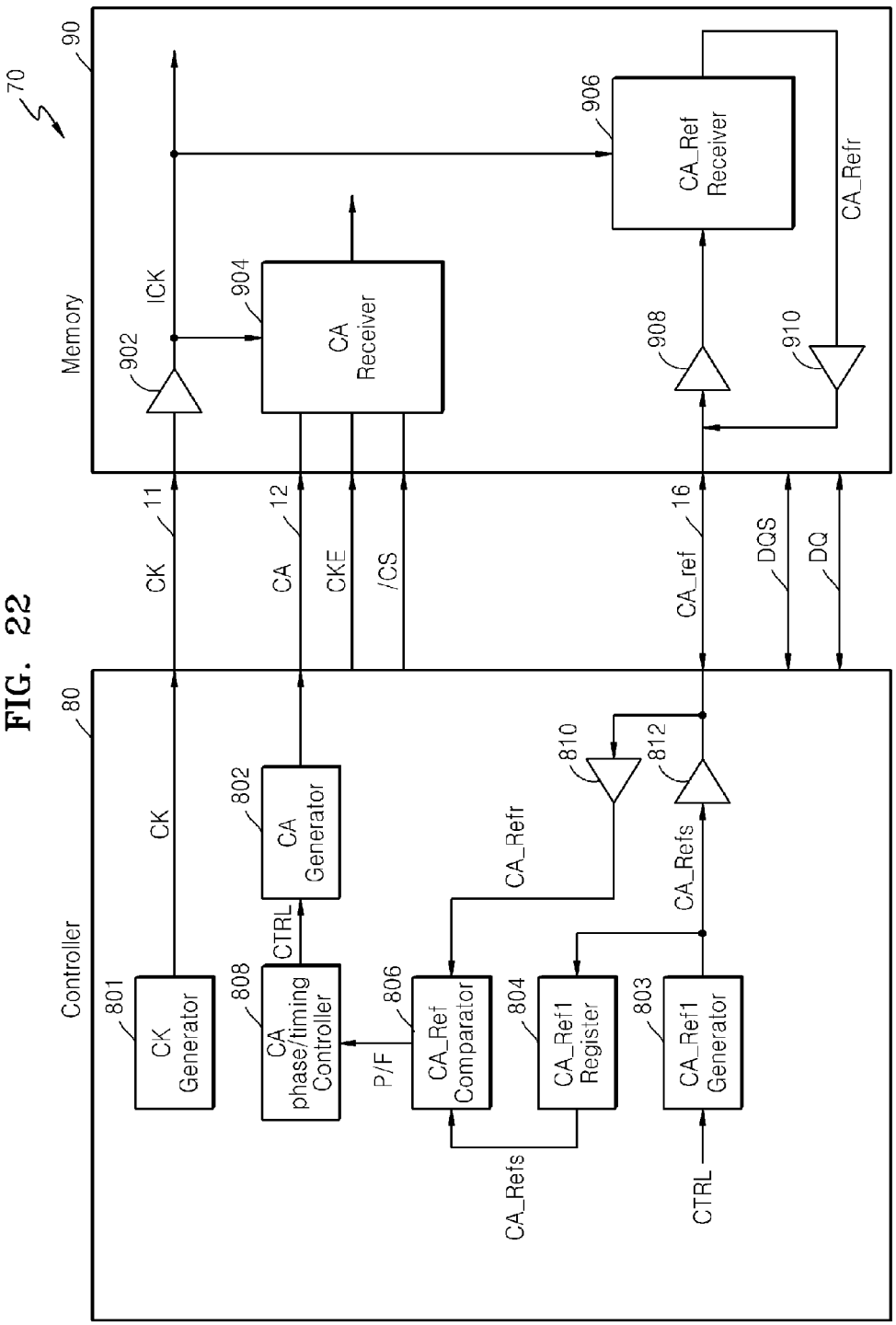
FIG. 22 is a block diagram showing another example of a memory system that may be used to implement one or more command/address calibration embodiments described herein.

FIG. 22 is a block diagram showing another example of a memory system that may be used to implement one or more command/address calibration embodiments described herein.

Referring to FIG. 22, a memory system 70 may include a memory controller 80 and a memory device 90. The memory controller 80 may include a clock generator 801, a command/address (CA) generator 802, a CA generation reference unit 803, a register unit 804, a comparator 806, a phase/timing controller 808, and data input/output units 810 and 812. The memory controller 80 provides the clock signal CK generated by the clock generator 801 to the memory device 90 through the clock signal line 11.

The memory system 70 additionally includes a CA reference signal line CA_Ref 16. The CA reference signal line CA_Ref 16 transmits a signal $CA\_Ref_s$ and receives a CA reference calibration information $CA\_Ref_r$ in the CA calibration mode of the command/address CA communications between the memory controller 80 and the memory device 70. CA reference calibration information $CA\_Ref_r$ is provided to the CA_Ref Comparator 806 to determine a result (e.g., pass P or fail F) of a cycle of the CA calibration, the result being provided to the phase/timing controller 808 to adjust the relative phase or timing of the command/address signal CA with respect to clock CK by providing a control signal CTRL to CA generator 802. Since a CA reference signal line CA_Ref 16 is provided, calibration of the command/address CA communications may be performed concurrently with transmission of the command/address signal(s) CA over the command/address bus 12.

The CA generator 802 generates a CA signal having a phase or timing that has been determined (possibly adjusted) in response to the control signal CTRL, and transmits the same to the memory device 90 through the command/address bus 12. The CA generation reference unit 803 may be configured identically to the CA generator 802 (e.g., same circuit construction that may use the same unit cells from a cell library), and generates the sent command/address reference signal $CA\_Ref_s$. The sent command/address reference signal $CA\_Ref_s$ may be the same as or completely independent from the command/address signal CA generated by the CA generator 802. The sent command/address reference signal $CA\_Ref_s$ may be generated with a phase determined by the control signal CTRL, which may provided by the CA phase timing controller 808 (or derived from information provided by the CA phase timing controller 808). The phase of the sent command/address reference signal $CA\_Ref_s$ controlled by control signal CTRL may be the same as the phase of a CA signal(s) output by the CA generator 802.

The sent command/address reference signal $CA\_Ref_s$ is provided to the register unit 804 to store the information represented by the sent command/address reference signal $CA\_Ref_s$. The sent command/address reference signal $CA\_Ref_s$ is provided to the CA reference signal line CA_ref 16 which transmits the sent command/address reference signal $CA\_Ref_s$ to the memory device 90.

The register unit 804 stores the information represented by the sent command/address reference signal $CA\_Ref_s$. The comparator 806 compares the information of the sent command/address reference signal $CA\_Ref_s$ stored in the register unit 804 with received command/address reference calibration information CA_Ref, received from the memory device 90 via the data input unit 810 of the memory controller 80. The comparator 804 compares information of the sent command/address reference signal $CA\_Ref_s$ stored in the CA_Ref Register 804 with received command/address reference calibration information $CA\_Ref_r$ to generate the pass signal P or the fail signal F. In a manner that may be the same as described herein with respect to other embodiments, the generation of the pass signal P or fail signal F is performed for each cycle of the command/address communication calibration (each cycle corresponding to a transmission of a $CA\_Ref_s$ at a particular phase), and the group of pass P and fail F signals generated during the command/address communication calibration mode may be used to determine an optimum relative phase between command/address signal(s) transmitted over the CA bus 12 and the clock CK.

For example, the phase/timing controller 808 generates the control signal CTRL instructing a phase shift of the command/address signal CA according to the group of pass or fail signals P or F generated by the comparator 808 during calibration mode. The control signal CTRL is used to determine (e.g., adjust or maintain) the relative phase or timing of the command/address signal CA and the clock CK and generate the phase-adjusted command/address signal CA which is transmitted over the command/address bus 12.

The data input unit 810, which may be an input buffer and/or amplifier, receives the received command/address reference calibration information $CA\_Ref_r$ from the memory device 90 through the CA reference signal line CA_ref 16 and delivers the received command/address reference calibration information $CA\_Ref_r$ to the comparator 806. The data output unit 812, which may be an output buffer and/or amplifier, receives the sent command/address reference signal $CA\_Ref_s$ generated by the CA generation reference unit 803 and transmits the sent command/address reference signal $CA\_Ref_s$ to the CA reference signal line CA_ref 16.

The memory device 90 includes a clock buffer 902, a CA receiver 904, a CA reference receiver 906, and input/output units 908 and 910 (which respectively may be input and output buffers and/or amplifiers). The clock buffer 902 receives the clock signal CK transmitted through the clock signal line 11 to generate the internal clock signal ICK. The internal clock signal ICK may have the same timing (e.g. phase and duty cycle) as the external clock signal CK, or they may be different (in phase and/or duty cycle, e.g.). The CA receiver 904 receives the chip selection signal /CS and the clock enable signal CKE, and the command/address signal(s) CA transmitted through the command/address bus 12. The clock enable signal CKE may be used as a pseudo command which acts as a read command of the command/address signal CA transmitted through the command/address bus 12 as described elsewhere herein. The CA receiver 304 may receive the command/address signal(s) CA when the clock enable signal CKE is in an active state.

The input unit 908 receives the sent command/address reference signal CA_Ref$_s$ transmitted from the memory controller 80 through the CA reference bus CA_ref 16, and transmits the same to the CA reception reference receiver 906. The CA reception reference receiver 906 may be configured identically as the CA receiver 904. The CA reception reference receiver 906 receives the chip selection signal /CS, the clock enable signal CKE, and the sent command/address reference signal CA_Ref$_s$ transmitted through the CA reference bus CA_ref 16, and latches the sent command/address reference signal CA_Ref$_s$ at a rising edge and/or falling edge of the clock ICK (which may be the same time as or dependent upon the time of the edges of the external clock CK). The latched information of the sent command/address reference signal CA_Ref$_s$ by the CA_Ref receiver 906 is the received command/address reference calibration information CA_Ref$_r$ which may or may not be the same as the information represented by sent command/address reference signal CA_Ref$_s$ (for example, based upon the timing of the latching resulting from the relative phase of the clock CK and the sent command/address reference signal CA_Ref$_s$ during this cycle of the command/address calibration.

The received command/address reference calibration information CA_Ref$_r$ may be the same as information obtained from a signal received over the CA bus 12 which is output from the CA receiver 904 to a source internal to the memory device 70 (after inputting the information to the CA receiver 904 when the CA receiver 904 receives the chip selection signal /CS, the clock enable signal CKE, and the command/address signal CA transmitted through the command/address bus 12 in response to the internal clock signal ICK). The received command/address reference calibration information CA_Ref$_r$ is transmitted to the memory controller 80 via CA reference signal line CA_ref 16 and the output unit 910.

The memory system 70 may perform plural cycles of the CA calibration, an exemplary single cycle being described as follows. The CA generator 802 of the memory controller 80 adjusts the phase or timing of the command/address signal CA in response to the control signal CTRL of the phase/timing controller 808. The CA generation reference unit 803 generates the sent command/address reference signal CA_Ref$_s$, which may be the same as the command/address signal CA, and transmits the sent command/address reference signal CA_Ref$_s$ to the memory device 90 via the CA reference signal line CA_ref 16. The CA reference receiver 906 of the memory device 90 inputs the sent command/address reference signal CA_Ref$_s$ at a time according to the internal clock signal ICK and enabled by the clock enable signal CKE, and generates the received command/address reference calibration information CA_Ref$_r$. The received command/address reference calibration information CA_Ref$_r$ of the memory device 90 is transmitted to the memory controller 80 via the CA reference signal line CA_ref 16.

The received command/address reference calibration information CA_Ref$_r$ is provided to the comparator 806. The comparator 806 compares the information of the information of the sent command/address reference signal CA_Ref$_s$ with received command/address reference calibration information CA_Ref$_r$ to generate the pass signal P or the fail signal F for this cycle of the command/address calibration. Through repetition of the foregoing CA calibration cycle, the phase/timing controller 808 of the memory controller 80 determines an optimum relative phase between the CA signal transmitted over the CA bus 12 by the CA generator 802 and the clock CK. This optimum relative phase may be chosen as described elsewhere herein and may promote input (e.g. latching) of the command/address signals transmitted during normal operation by the CA bus 12 by the CA receiver 904 at timing corresponding to the middle portion of the command/address signal CA logic window (e.g., such that the middle of the command/address signal logic window corresponds to an edge of the clock signal CK and/or internal clock signal ICK).

While calibration of a single command/address signal CA of the CA bus 12 has been described in the current embodiment, the calibration described may be used to adjust the phase of signals transmitted on all signal lines of the command/address bus 12. This may be done using only the single CA_ref signal line 16 (applying its calibration results to all signal lines of the command/address bus 12). Alternatively, the CA_ref signal line 16 may be one of plural CA_ref signal lines, each of which are used to adjust a corresponding one or group of signal lines of the CA bus 12. In addition, each of the plural CA_ref signal lines 16 may be a signal line adjacent to the signal line(s) of the CA bus 12 that it is used to calibrate (e.g., immediately adjacent or within 2 or 3 signal lines, e.g.). This may include plural CA_ref signal lines interposed between the signal lines of the CA bus 12. Also, in alternative embodiments, the CA_ref line(s) 16 may serve other purposes during modes (e.g., normal operation) outside the CA calibration (e.g., transmission of power or other information signals).

The memory controller and memory devices described herein may take many forms. For example, the memory controller may comprise a semiconductor chip or may be a package (e.g., one or more chips encapsulated in a protective casing, such as resin). The memory device may comprise a semiconductor chip or may be a package (e.g., one or more semiconductor memory chips encapsulated in a protective casing, such as resin). The memory device may be a NAND flash memory (including 3D NAND flash memory), DRAM, PRAM, RRAM and/or MRAM. The memory controller and memory device may be packaged in the same semiconductor package (e.g. a memory controller chip and one or more memory chips stacked together and encapsulated in a package). The controller/device package may be a package-on-package (POP).

The controller may comprise a portion of a master memory chip which acts as a master for one or more slave memory chips, the described calibration being performed for command/address communications between the master memory chip and one or more of the slave memory chips. The master memory chip and one or more slave chips may be stacked and communicate via through substrate vias (TSVs) such as through silicon vias of each chip connected to one another (where all or some of the clock line 11, the command/address bus 12, the DQ bus 13, the chip select signal line/CS, the clock enable CKE, and the data strobe line DQS described herein are formed by one or more of the through silicon vias). The memory controller and memory device(s) may be elements of a memory card (embedded or removable).

The memory controller and memory device(s) may be mounted on the same printed circuit board or plural circuit boards connected within a single computing system, which may include printed circuit board(s) comprising elements of a memory module, a motherboard of a computing device (for example, a personal computer) or other printed circuit boards (such as within a mobile phone, personal data assistant (PDA), or computer tablet).

For certain applications, controller and memory device may integrally formed with the same monolithic semiconductor substrate (e.g., part of the same semiconductor chip). For example, the memory may be embedded memory in a microprocessor, a communications chip, or a digital signal processor.

Also, while the embodiments above have been described as relating to a memory system, the invention may also be used to calibrate other command/address communications outside of memory systems, such as between nodes of a motherboard interconnect for servers, computers, etc. to assist communications between devices attached to the motherboard.

Also, while the embodiments describe an example of the command/address calibration information transmitted from the memory device to the memory controller is the interpretation of the command/address calibration signal sent from the memory controller to the memory device (e.g., as input by the memory device), however, other types of information may be sent. For example, if the test pattern is predetermined (whether programmed at manufacturing, or just prior the command/address calibration), the memory device itself may determine whether the information it has input is input without error to provide a pass P or fail F indication in response thereto to the memory controller. Alternatively, the memory device may contain logic to expect a certain relationship between the a series of bits comprising the test pattern sent during a cycle of the calibration, and/or between bits of the bits received in parallel as part of the test pattern (and thus generate a pass or fail signal to send to the memory controller).

Also, the calibration of the command/address communications has been described to calibrate a timing for input of the command/address signals into the memory device, however, other types of calibration of the command/address communications may be performed. For example, for each cycle of the command/address communication calibration, the controller may alter a signal power, a terminal impedance (e.g., an adjustable on die termination (pull-up and/or in series) of the controller and/or the memory device, and/or a duty cycle of the command/address calibration signal.

It should be noted that the description describes the calibration of a command/address communications with calibration test pattern signals sent over a command/address bus. It is contemplated that certain implementations will allow for certain, but not all, of the signal lines of a command/address bus to be shared for both command and address information during normal operation. For example, a design may require 22 address bits and 10 command bits which may result in one or more of the signal lines of the command/address bus that is not used to transmit a command bit (e.g., if the command/address bus 12 consisted of eleven signal lines to transmit twenty-two (22) address bits (two sets of eleven (11) bits in sequence), communications may require only ten (10) bits of a command on the eleven (11) signal lines leaving one of the signal lines unused for command communications. As another example, all signal lines of the command/address bus may be used for command communications but some of the signal lines may be unused for address communications (e.g., eleven bits for a command information and twenty (20) bits of address information may leave one of the signal lines of an eleven signal line command/address bus unused for address communications).

While the inventive concept has been particularly shown and described with reference to exemplary embodiments thereof, they are provided for the purposes of illustration, and it will be understood by those of ordinary skill in the art that various modifications and equivalent other embodiments can be made from the inventive concept. Accordingly, the scope of the inventive concept should be defined by the appended claims.

What is claimed is:

1. A method of calibrating communication over a command/address bus of a memory device, comprising:
receiving a clock signal over a clock signal line;
receiving a calibration enabling command through command/address terminals at a first rising edge of the clock signal, wherein the command/address terminals comprise CA0, CA1, CA2, CA3, CA4 and CA5;
receiving a first command/address signal through at least some of the command/address terminals at a second rising edge of the clock signal and generating first information in response to the receiving of the first command/address signal, wherein a signal element of the first command/address signal received by a first command/address terminal and the second rising edge of the clock signal have a first phase difference;
transmitting the first information through a first set of data terminals;
receiving a second command/address signal through the at least some of the command/address terminals at a third rising edge of the clock signal and generating second information in response to receiving the second command/address signal, wherein a signal element of the second command/address signal received by the first command/address terminal and the third rising edge of the clock signal have a second phase difference; and
transmitting the second information through the first set of data terminals,
wherein the first phase difference and the second phase difference are different from each other.

2. The method of claim 1, wherein the method further includes receiving a calibration disabling command through command/address terminals at a fourth rising edge of the clock signal.

3. The method of claim 1, wherein the at least some of the command/address terminals are CA0, CA1, CA2, CA3, CA4 and CA5.

4. The method of claim 1, wherein the first set of data terminals includes DQ8, DQ9, DQ10, DQ11, DQ12 and DQ13.

5. A method of calibrating communication over a command/address bus of a memory device, comprising:
receiving a clock signal over a clock signal line;
receiving a calibration enabling command through command/address terminals at a first rising edge of the clock signal, wherein the command/address terminals comprise CA0, CA1, CA2, CA3, CA4 and CA5;
receiving a first command/address signal through at least some of the command/address terminals at a second rising edge of the clock signal and generating first information in response to receiving the first command/address signal, wherein a signal element of the first command/address signal received by a first command/address terminal and the second rising edge of the clock signal have a first phase difference;
transmitting the first information through a first set of data terminals;
receiving a second command/address signal through the at least some of the command/address terminals at a third rising edge of the clock signal and generating second information in response to receiving the second command/address signal, wherein a signal element of the second command/address signal received by the first command/address terminal and the third rising edge of the clock signal have a second phase difference; and transmitting the second information through the first set of data terminals, wherein the first phase difference and the second phase difference are different from each other, receiving command information through the command/address terminals and receiving address information through the command/address terminals at rising edges of the clock signal.

6. The method of claim 5, wherein the command/address terminals receive signals transmitted over a command address bus, wherein the method further comprises receiving a read request signal over a first line separate from the command/address bus, and wherein the generating of the first information and the second information is responsive to the receiving of the read request signal.

7. The method of claim 6, wherein the first line is a clock enable line, and the method further comprises generating an internal clock signal in response to the receiving of the read request signal.

8. The method of claim 5, wherein the command/address terminals receive signals transmitted over a command address bus, and wherein the receiving of the first command/address signal comprises receiving a training pattern over all of multiple lines of the command/address bus.

9. The method of claim 8, further comprising receiving the command information and the address information over the command/address bus as third command/address signals, wherein a phase between signal elements of the third command/address signals and the clock signal is individually adjusted for each of the multiple lines of the command/address bus.

10. The method of claim 5, wherein the command/address terminals receive signals transmitted over a command address bus, and wherein receiving the command information and the address information comprises receiving over each of a majority of lines of the command/address bus both the address information and the command information.

11. The method of claim 5, wherein the first command/address signal is received as a first parallel signal comprising a plurality of first signal elements, each first signal element being received by a corresponding one of the at least some of the command/address terminals, wherein the second command/address signal is received as a second parallel signal comprising a plurality of second signal elements, each second signal element being received by a corresponding one of the at least some of the command/address terminals, wherein the method further comprises receiving the command information as a third command/address signal comprising a plurality of third signal elements, each third signal element being received by a corresponding one of the at least some of the command/address terminals wherein a difference in (i) the phase difference between the first signal element received by the first command/address terminal and the clock signal and (ii) the phase difference between the first signal element received by a second command/address terminal and the clock signal is not the same as (iii) the phase difference between the third signal element received by the first command/address terminal and the clock signal and (iv) the phase difference between the third signal element received by the second command/address terminal and the clock signal.

\* \* \* \* \*